(12) United States Patent
Bouvier

(10) Patent No.: US 11,886,777 B2
(45) Date of Patent: Jan. 30, 2024

(54) 3D DESIGN OF B-REP SKIN

(71) Applicant: DASSAULT SYSTEMES, Velizy Villacoublay (FR)

(72) Inventor: Vincent Bouvier, Velizy Villacoublay (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 226 days.

(21) Appl. No.: 16/665,913

(22) Filed: Oct. 28, 2019

(65) Prior Publication Data

US 2020/0134245 A1 Apr. 30, 2020

(30) Foreign Application Priority Data

Oct. 26, 2018 (EP) .................................... 18306397

(51) Int. Cl.
*G06F 30/17* (2020.01)
*G06F 30/12* (2020.01)

(52) U.S. Cl.
CPC .............. *G06F 30/17* (2020.01); *G06F 30/12* (2020.01)

(58) Field of Classification Search
CPC ................................ G06F 30/17; G06F 30/12
See application file for complete search history.

(56) References Cited

U.S. PATENT DOCUMENTS

| | | | | |
|---|---|---|---|---|
| 6,120,171 A * | 9/2000 | Shaikh | .................... | G06T 17/10 |
| | | | | 345/685 |
| 9,196,090 B2 * | 11/2015 | Maisonneuve | ......... | G06F 30/17 |
| 9,269,189 B1 * | 2/2016 | Marinov | ................. | G06T 17/30 |
| 10,210,304 B2 * | 2/2019 | Santiquet | ................ | G06F 30/17 |
| 2004/0070583 A1 * | 4/2004 | Tsai | ........................ | G06T 17/10 |
| | | | | 345/419 |
| 2004/0113910 A1 * | 6/2004 | Tsai | ........................ | G06T 17/20 |
| | | | | 345/420 |

(Continued)

FOREIGN PATENT DOCUMENTS

| | | | | |
|---|---|---|---|---|
| CN | 107526859 A | * | 12/2017 | ......... B29C 33/3835 |
| JP | 2001216345 A | * | 8/2001 | |

(Continued)

OTHER PUBLICATIONS

Sang et al.; "Sheet modelling and thickening operations based on non-manifold boundary representations"; Proceedings of DETC'01 (Year: 2001).*

(Continued)

*Primary Examiner* — Rehana Perveen
*Assistant Examiner* — Nupur Debnath
(74) *Attorney, Agent, or Firm* — Oblon, McClelland, Maier & Neustadt, L.L.P.

(57) ABSTRACT

The disclosure notably relates to a method for designing a 3D modeled object that represents a mechanical part. The method includes obtaining, at a CAD system, a B-Rep skin which represents the mechanical part. The B-rep skin has a B-rep portion which includes a boundary face. The method also includes defining, by graphical user-interaction with the CAD system, a surface, and constructing, automatically by the CAD system, a B-rep replacement. The method further includes replacing, in the B-Rep skin, the B-rep portion by the B-rep replacement. This offers a "replace face" functionality when designing a B-Rep skin.

20 Claims, 21 Drawing Sheets

(56) References Cited

U.S. PATENT DOCUMENTS

| | | | |
|---|---|---|---|
| 2014/0012547 A1* | 1/2014 | Mattson | G06T 19/20 |
| | | | 703/1 |
| 2016/0055266 A1* | 2/2016 | Tomono | G06F 30/00 |
| | | | 703/1 |
| 2017/0160726 A1* | 6/2017 | Rameau | G06T 17/005 |
| 2017/0177745 A1* | 6/2017 | Sheng | G06F 30/17 |
| 2017/0220730 A1* | 8/2017 | Marini | G06T 17/00 |

FOREIGN PATENT DOCUMENTS

| | | | | |
|---|---|---|---|---|
| JP | 2001-243269 A | 9/2001 | | |
| JP | 2004-287701 A | 10/2004 | | |
| JP | 2017-174409 A | 9/2017 | | |
| WO | WO-2018059155 A1 * | 4/2018 | | G06T 17/30 |

OTHER PUBLICATIONS

Pal Benko et al. "Algorithms for reverse engineering boundary representation models"; https://people.eecs.berkeley.edu/~sequin/CS284/PAPERS/Benko_RevEng-Brep.pdf (Year: 2001).*

Kun Jiang et al.; "A 3D curve offset Approach for Ruled Surface generation in Engineering Design" (Year: 2012).*

Solidworks Tech Blog; https://blogs.solidworks.com/tech/search/offset (Year: 2017).*

Jihua Wang; "Research on Shape Feature Recognition of B-Rep Model Based on Wavelet Transform"; Hindawi Mathematical Problems in Engineering vol. 2018, (Year: 2018).*

Christian Van der Velden; "Extracting Engineering Features From Brep Geometric Models"; 27th International Congress of the Aeronautical Sciences (Year: 2010).*

"Modeling a Part Using Surfaces—Solid Edge Velocity Series With Synchronous Technology"; spse01560; 2010 Siemens Product Lifecycle Management Software Inc. (Year: 2010).*

G.V.V. Ravi Kumar et al.; "Computing constant offsets of a NURBS B-Rep"; Computer-Aided Design 35 (2003) 935-944 (Year: 2003).*

G.V.V. Ravi Kumar et al.; "Computing offsets of trimmed NURBS surfaces"; computer-Aided Design 35(2003) 411-420 (Year: 2003).*

Jianjun Chen et al.; "Automatic surface repairing, defeaturing and meshing algorithms based on an extended B-rep"; Advances in Engineering Software 86 (2015) 55-69 (Year: 2015).*

Zhi Li et al.; "Local Symmetry Based Hint Extraction of B-Rep Model for Machining Feature Recognition"; Technical Conferences and Computers and Information in Engineering Conference, IDETC/CIE 2018 (Year: 2018).*

Byung Chul Kim et al.; "Stepwise volume decomposition for the modification of B-rep models"; Int J Adv Manuf Technol (2014) 75: 1393-1403 (Year: 2014).*

Zhi Li et al.; "A geometric reasoning approach to hierarchical representation for B-rep model retrieval"; Computer-Aided Design 62 (2015) 190-202 (Year: 2015).*

Office Action dated Apr. 9, 2019 in European Patent Application No. 18306397.3-1224.

Sang Hun Lee, et al.; "Sheet Modeling and Thickening Operations Based on Non-Manifold Boundary Representations"; Proceedings of DETC'01; ASME2001 Design Engineering Technical Conferences; Sep. 9-12, 2001; DETC2001/DAC-21010.

"Modeling a Part Using Surfaces"; Solid Edge Velocity Series With Synchronous Technology.

Keith D. Hjelmstad; "Fundamentals of Structural Mechanics"; Second Edition; University of Illinois at Urbana-Champaign; Urbana-Champaign, Illinois, Springer; ISBN 0-387-23330-X; eISBN 0-387-23331-8; 2005.

https://www.youtube.com/watch?v=mwZKhQN7cbc; "Replace Face Solid Catia", Uploaded by Mechanical Engineering; Jan. 20, 2017.

https://www.youtube.com/watch?v=mLNFdAdPw-M; "Onshape Replace Face", Uploaded Mar. 28, 2018.

https://www.youtube.com/watch?v=VwDoroZrow; "Solid Edge Surfacing Tutorial: How to Use Replace Face"; Solid Mastermind; Published May 5, 2010.

Notification of Refusal dated Jul. 25, 2023, issued in corresponding Japanese patent application No. 2019-193805 (with English translation).

* cited by examiner

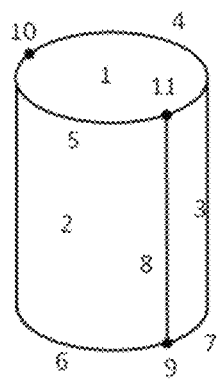
FIG. 10
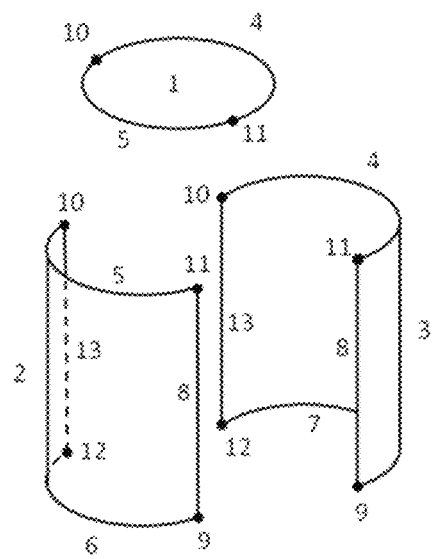
FIG. 11
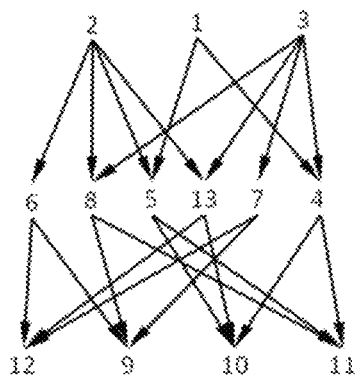
FIG. 12
| | |
|---|---|
| 1 → | Plane |
| 2 → | Cylindrical surface |
| 3 → | |
| 4 → | Circle 1 |
| 5 → | |
| 6 → | Circle 2 |
| 7 → | |
| 8 → | Line 1 |
| 13 → | Line 2 |
| 10 → | Point 1 |
| 11 → | Point 2 |
| 12 → | Point 3 |
| 9 → | Point 4 |
FIG. 13
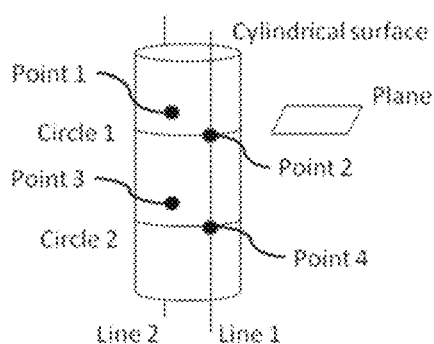
FIG. 14

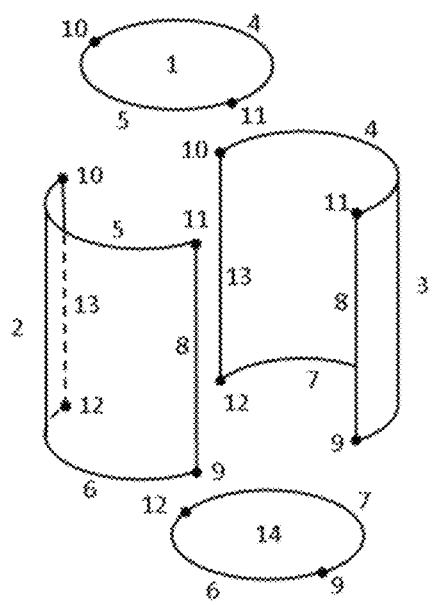
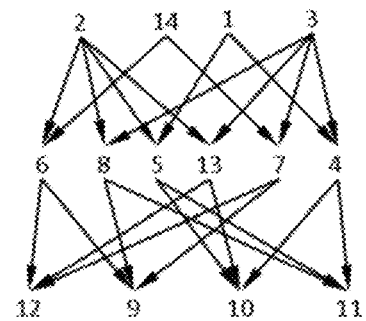
FIG. 15
FIG. 16
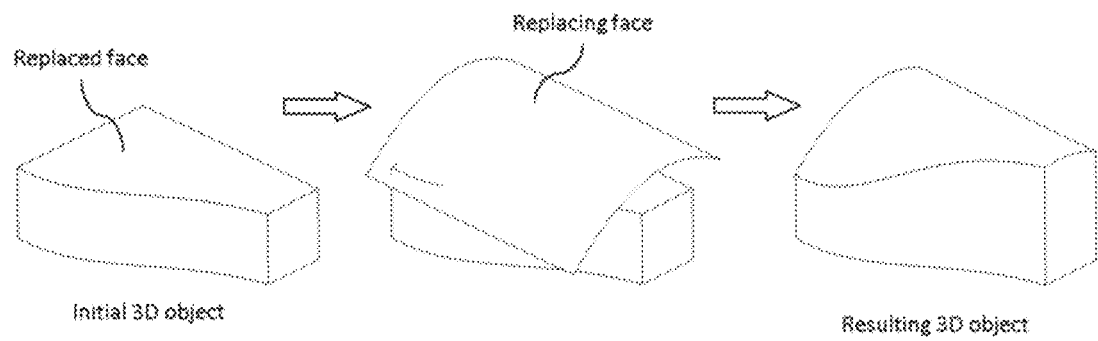
FIG. 17
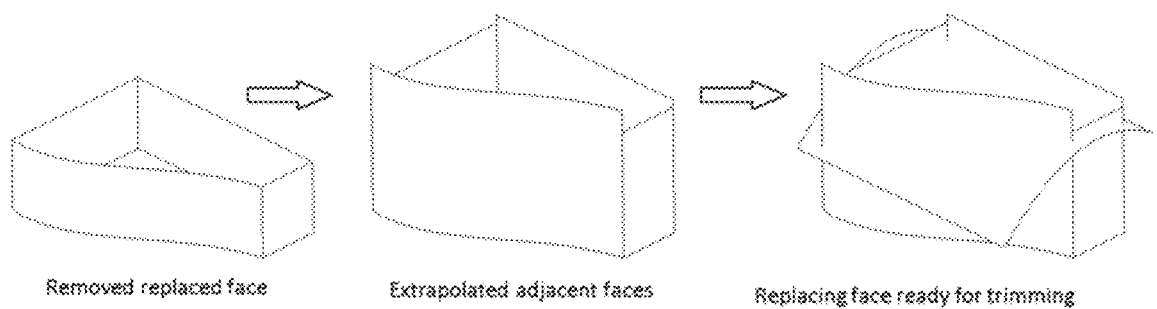
FIG. 18

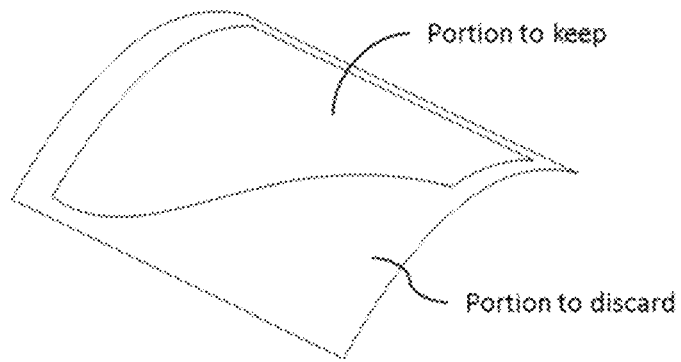
FIG. 19
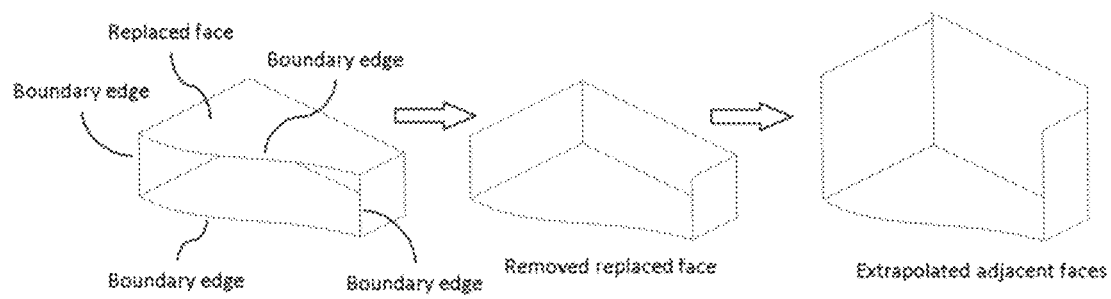
FIG. 20
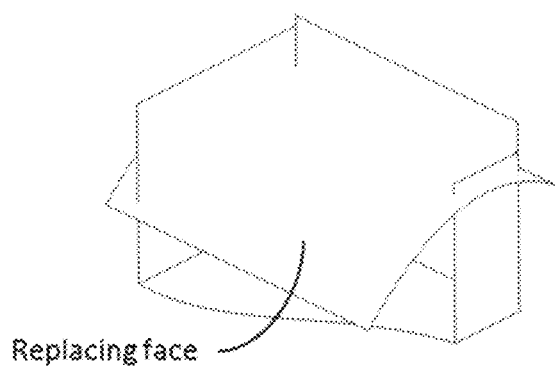
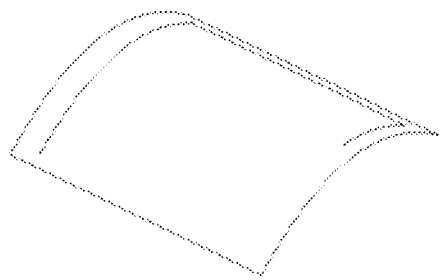
FIG. 21                    FIG. 22

3D DESIGN OF B-REP SKIN

CROSS-REFERENCE TO RELATED APPLICATIONS

This application claims priority under 35 U.S.C. § 119 or 365 to European Application No. EP 18306397.3, filed Oct. 26, 2018. The entire contents of the above application(s) are incorporated herein by reference.

FIELD OF THE INVENTION

The invention relates to the field of computer programs and systems, and more specifically to a method, system and program for designing a 3D modeled object that represents a mechanical part.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Many existing CAD systems allow designers to model mechanical parts with the boundary representation (B-Rep) format, via graphical user-interaction. In this framework, ergonomics of the user-interaction is of particular importance. For this reason, some CAD systems provide a functionality where a user can define a surface intended for replacement of a given face of a B-Rep volume (i.e. a closed B-Rep), and then the system automatically updates the B-Rep volume such that the given face is replaced by a new face created according to the defined surface. This is notably the case of software solutions distributed under the trademarks Onshape, SolidEdge, and ProEngineer.

However, there is still a need for a CAD system providing such a functionality when designing a B-Rep skin (i.e. an open B-Rep).

SUMMARY OF THE INVENTION

It is therefore provided a computer-implemented method for designing a 3D modeled object that represents a mechanical part. The method comprises providing, at a CAD system, a B-Rep skin. The B-Rep skin represents the mechanical part. The B-rep skin has a B-rep portion. The B-Rep portion includes a boundary face bounded by one or more boundary edges of the B-rep skin, and one or more first faces each adjacent to the boundary face at a respective internal edge of the B-rep skin. The method also comprises defining, by graphical user-interaction with the CAD system, a surface. The method also comprises constructing, automatically by the CAD system, a B-rep replacement. The constructing includes creating one or more second faces each adjacent to the boundary face and bounded by a respective boundary edge of the B-rep skin. The constructing also includes generating a B-rep assembly. The B-rep assembly includes one or more third faces each coincident with the surface. Each third face has one or more edges. Each edge of each third face is internal to the B-rep assembly. The B-rep assembly includes also includes one or more fourth faces each coincident with a respective first face and adjacent to a respective third face. The B-rep assembly includes also includes one or more fifth faces each coincident with a respective second face and adjacent to a respective third face. The constructing further includes removing from the B-rep assembly each fifth face. The method further comprises replacing, in the B-Rep skin, the B-rep portion by the B-rep replacement.

Such a method improves ergonomics when designing a B-Rep skin that represents a mechanical part, by graphical user-interaction with a CAD system.

Notably, the method allows a user-interaction where the user graphically defines a surface, and the CAD system automatically constructs a B-Rep replacement for a B-rep portion of the B-Rep skin. Thanks to the one or more third faces being each coincident with the surface, the method is intuitive and thus ergonomic since the user directly defines geometry eventually part of the result when defining the surface. And thanks to the one or more fourth faces being each coincident with a respective first face and adjacent to a respective third face, the method constructs a B-Rep replacement with which is consistent with the initial geometry of the B-Rep skin, in other words with minimal changes of the initial geometry.

In addition, the method is adapted for such a construction in the case of a B-Rep skin in particular, since it performs even though the B-rep portion includes a boundary face, in other words a face bounded by one or more boundary edges of the B-rep skin. For that, the method creates one or more second faces each adjacent to the boundary face and bounded by a respective boundary edge of the B-rep skin. The one or more second faces are then processed during the generation similarly as the one or more first faces, that is, so as to yield one or more fifth faces each coincident with a respective second face and adjacent to a respective third face. This provides robustness to the method. And when the face to be replaced is surrounded all around by adjacent faces (first and second faces), the generating of the third, fourth and fifth faces can be performed in a robust manner respecting user-intent.

Furthermore, this similar processing of first and second faces makes the functionality easily programmable to work both in the case of the method where the face to be replaced is a boundary face of a B-Rep skin, as well as in the case where the face to be replaced is an internal face of a B-Rep skin or of a B-Rep volume. Indeed, the program may simply comprise testing a condition for running or not the creating of the one or more second faces and the generating and removing of the one or more fifth faces, the condition being positive when the face to be replaced is a boundary face bounded by one or more boundary edges and negative otherwise. The program may for its other modules run in an idents way whether the condition is positive or negative. Such a program may apply to all situations since it may take as an input to be replaced a boundary face of a B-Rep skin as in the method, or an internal face of a B-Rep skin or of a B-Rep volume.

The method may comprise one or more of the following:
the creating comprises thickening the B-rep portion;
the thickening comprises determining a B-rep offset of the B-rep portion, building one or more lateral faces that connect the B-rep offset to the B-rep portion, and determining the one or more second faces from the one or more lateral faces;
the one or more lateral faces include one or more lateral ribbon faces, each lateral ribbon face being bounded by a respective boundary edge of the B-rep portion and a corresponding boundary edge of the B-rep offset, each lateral ribbon face adjacent to the boundary face and bounded by a respective boundary edge of the B-rep skin forming a respective second face;
each lateral ribbon face forming a respective second face is supported by a ruled surface;
the ruled surface is of the type $(w,t) \mapsto L(w,t)$ with $L(w,t)=S(u(w),v(w))+t\delta N(u(w),v(w))$, where: S is a supporting surface of F defined for parameters u and v, with F being a face of the B-rep portion bounded by the respective boundary edge, $\delta$ is an offset value, $N(u,v)$ is a normal vector of S defined for the parameters u and v, with being $\tilde{S}$ a supporting surface of $\tilde{F}$ defined for the parameters u and v by $\tilde{S}(u,v)=S(u,v)+\delta N(u,v)$, with $\tilde{F}$ being a face of the B-rep offset bounded by the corresponding boundary edge, w is a parameter such that $w \mapsto S(u(w),v(w))$ is a 3D curve supporting the respective boundary edge, and t is a parameter $t \in [0,1]$;
the mechanical part comprises a bent and/or stamped planar sheet;
the boundary face is fully located on a respective side of the surface, the thickening being performed in a direction opposite to the surface;
the method further comprises, prior to the providing of the B-Rep skin, providing an initial B-Rep skin that represents the mechanical part, the initial B-Rep skin having an initial boundary face, the surface partitions the initial boundary face into several boundary sub-faces, a respective boundary sub-face forming the boundary face of the B-Rep portion, the providing of the B-Rep skin comprises partitioning the initial B-Rep skin into several B-Rep sub-skins, a respective B-Rep sub-skin forming the B-Rep skin, each other B-Rep sub-skin has a respective B-Rep portion including a respective boundary sub-face bounded by one or more boundary edges of the other B-Rep sub-skin, and the constructing and the replacing is performed for each other B-Rep sub-skin relative to its respective B-Rep portion;
the generating comprises producing: one or more third faces each by extrapolating and/or trimming the surface, one or more fourth faces each by extrapolating and/or trimming a supporting surface of the respective first face, and/or one or more fifth faces each by extrapolating and/or trimming a supporting surface of the respective second face;
extrapolating a surface comprises: when the surface is a canonical surface having a 2D parametric domain, extending the 2D parametric domain, when the surface is a procedural surface having input elements defining a 3D motion for sweeping a planar profile, extrapolating the input elements, and/or when the surface is a free-form surface, extending the surface curvature-continuously; and/or
the mechanical part is: an automotive part, an aerospace part, a consumer good part, a defense part, an architecture part, a ship building part, a mining industry part, a marine and offshore part, or an industrial equipment part, a thin part, and/or a composite part, a plastic molded part, or a stamped part.

It is further provided a computer program comprising instructions for performing the method.

It is further provided a computer readable storage medium having recorded thereon the computer program.

It is further provided a CAD system comprising a processor coupled to a memory and a graphical user interface, the memory having recorded thereon the computer program.

BRIEF DESCRIPTION OF THE DRAWINGS

Embodiments of the invention will now be described, by way of non-limiting example, and in reference to the accompanying drawings, where:

FIGS. 10, 11, 12, 13, 14, 15 and 16 illustrate the B-Rep format;

FIGS. 17, 18 and 19 illustrate a "replace face" operation on a B-Rep volume;

FIGS. 20, 21 and 22 illustrate the issue of the "replace face" operation with a B-Rep skin solved by the method;

DETAILED DESCRIPTION OF THE INVENTION

Figure 1:
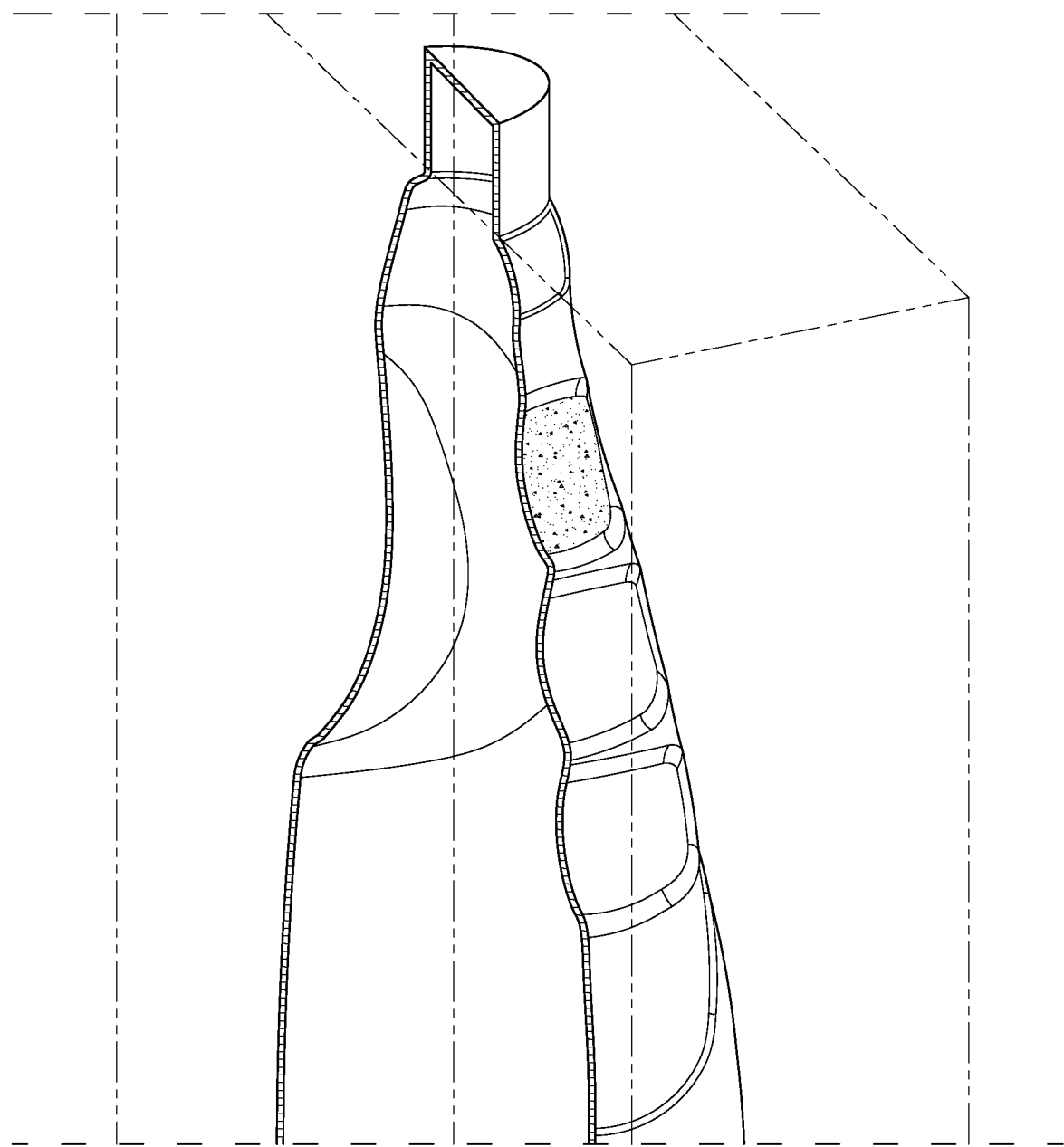
FIGS. 1, 2, 3, 4, 5, 6 and 7 show examples of mechanical parts which may be designed by the method.

The method is computer-implemented. This means that steps (or substantially all the steps) of the method are executed by at least one computer forming the CAD system. Thus, each step of the method is performed by a processor of the CAD system, possibly fully automatically, or, via user-interaction. In examples, the triggering of at least some of the steps of the method may be performed through user-interaction.

The CAD system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database). The CAD system may comprise a display unit for the graphical user interface to display any information, e.g. to a user of the method.

For example, the providing of the B-Rep skin may be performed via user-interaction. The user may design an initial B-Rep skin from scratch by graphical user-interaction with the CAD system, and/or retrieve an initial B-Rep skin already-designed and optionally, by graphical user-interaction with the CAD system, edit the retrieved initial B-Rep skin. The user may then define the surface, by graphical user-interaction with the CAD system. This may be performed after the user launching a respective functionality of the system, e.g. dedicated to performing the method (such as a "replace face" functionality), for example through menu-selection and/or graphical and/or keyboard input. The B-Rep inputted to the method may be such initial B-Rep (optionally edited) or, as discussed later, a B-Rep sub-skin resulting from a partitioning of said initial B-Rep, which may be performed automatically. In both cases, the construction of the B-rep replacement is performed automatically by the CAD system, such that the user need not intervene. The replacing of the B-rep portion by the B-rep replacement may be performed automatically. Said replacing may follow automatically the construction or alternatively be triggered by the user, for example after automatically displaying to the user a preview of the result of the displaying and the user validating said result. By "graphical user-interaction" in the context of defining a geometrical object, it is merely referred to the generic graphical design capability of CAD systems. It is hereby meant any user-interaction where the designer employs a haptic system (e.g. a mouse or a touch device such as a sensitive/touch screen or a sensitive/touch pad) to activate one or more locations of a design scene which is represented on the display unit and where the geometrical object is to be positioned. Activating a location of a scene may comprise positioning thereon the cursor of a mouse or performing a touch thereon. Substantially real-time after the activation, at least a part of the geometrical object is displayed. In particular, the definition of the surface may comprise the user graphically interacting with a scene where the B-Rep skin is displayed, while the B-Rep skin is displayed, so as to position and visualize the surface with respect to the B-Rep skin. The CAD system thus provides a visual feedback to the user defining the surface.

The method generally manipulates modeled objects. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

By "mechanical part", it is meant any product or portion of a product to be manufactured in the real world subsequent to the completion of its virtual design with for instance a CAD software solution or CAD system. The mechanical part may be an assembly of parts (e.g. a mobile mechanism), a single rigid part, or a portion of a rigid part. By "representing a mechanical part" for a modeled object, it is hereby meant that the geometry of the modeled object represents a spatial distribution of material of one or more class A surfaces of the mechanical part, which, by definition, are the outer surfaces of the virtual product that are visible to the end user. In particular the B-Rep skin may represent at least partly (e.g. fully) the material envelope of the mechanical part (i.e. at least part of the outer skin of the mechanical part).

A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semi-conductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

The mechanical part may in particular be an automotive part (i.e. a mechanical part of an automotive/car), an aerospace part (i.e. a mechanical part of an aerospace vehicle such as a satellite), a consumer good part (i.e. a part of a product or a product that can be positioned on a shelf and/or packed and purchased), a defense part (i.e. a mechanical part of a vehicle or real object used for defense), an architecture part (i.e. a part of an architectural object such as a wall of a building or a whole building), a ship building part, a marine and offshore part (e.g. used on an oil offshore platform), a mining industry part (i.e. a mechanical part of an equipment used for mining), or an industrial equipment part (such as a manufacturing machine part). Such mechanical parts are indeed well and often represented by B-Rep skins. Additionally or alternatively, the mechanical part may be a thin part. A thin part is a mechanical part which may be obtained by forming an initial sheet metal material. The magnitude of the sheet metal thickness may be higher than 0.1 mm and/or lower than 10 mm, for example of the order 1 mm, and/or the size may be higher than 0.1 m×0.1 m and/or lower than 10 m×10 m, for example of the order 1 m×1 m. Such a mechanical part is well-represented by a B-Rep skin, since its thickness is negligible for the purpose of representation. Additionally or alternatively, the mechanical part may be a composite part, a plastic molded part, or a stamped part. Such mechanical parts are indeed well and often represented by B-Rep skins, and they are often thin parts. Furthermore, many automotive parts, aerospace parts, or consumer goods are manufactured this way.

Figure 2:
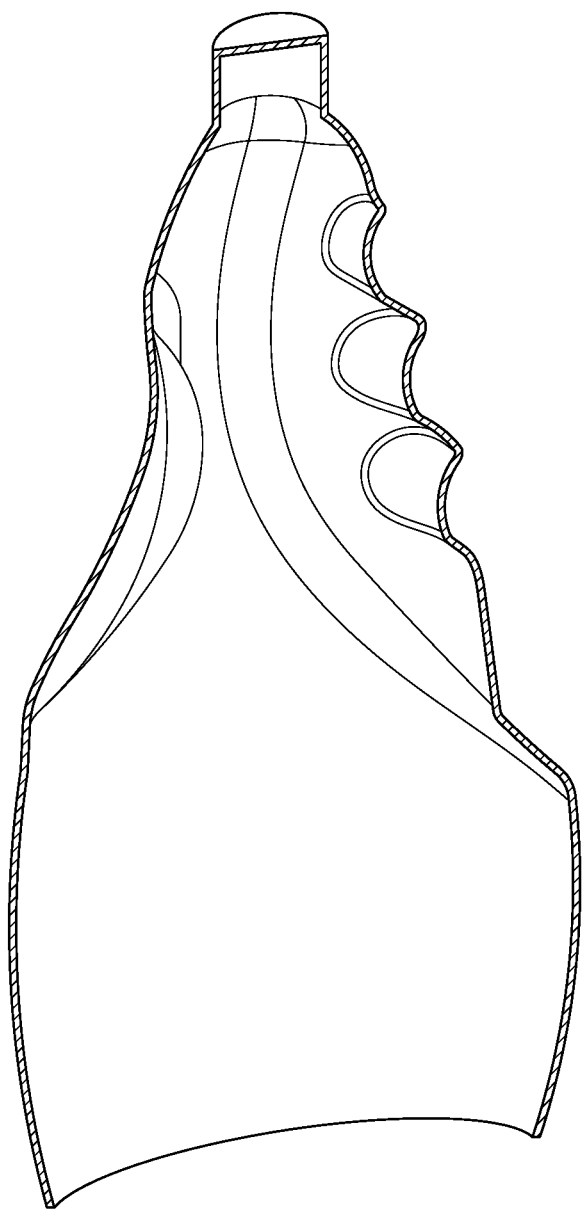
Figure 3:
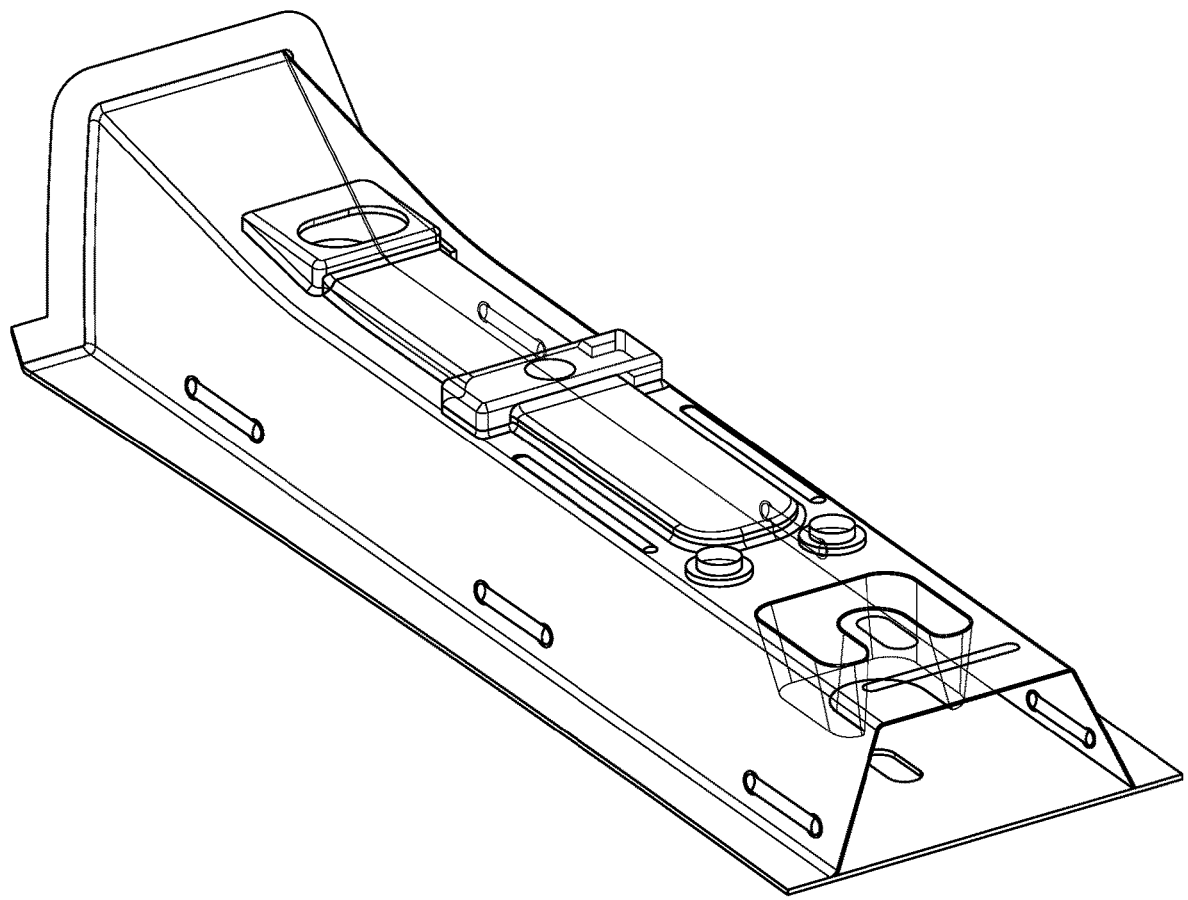
Figure 4:
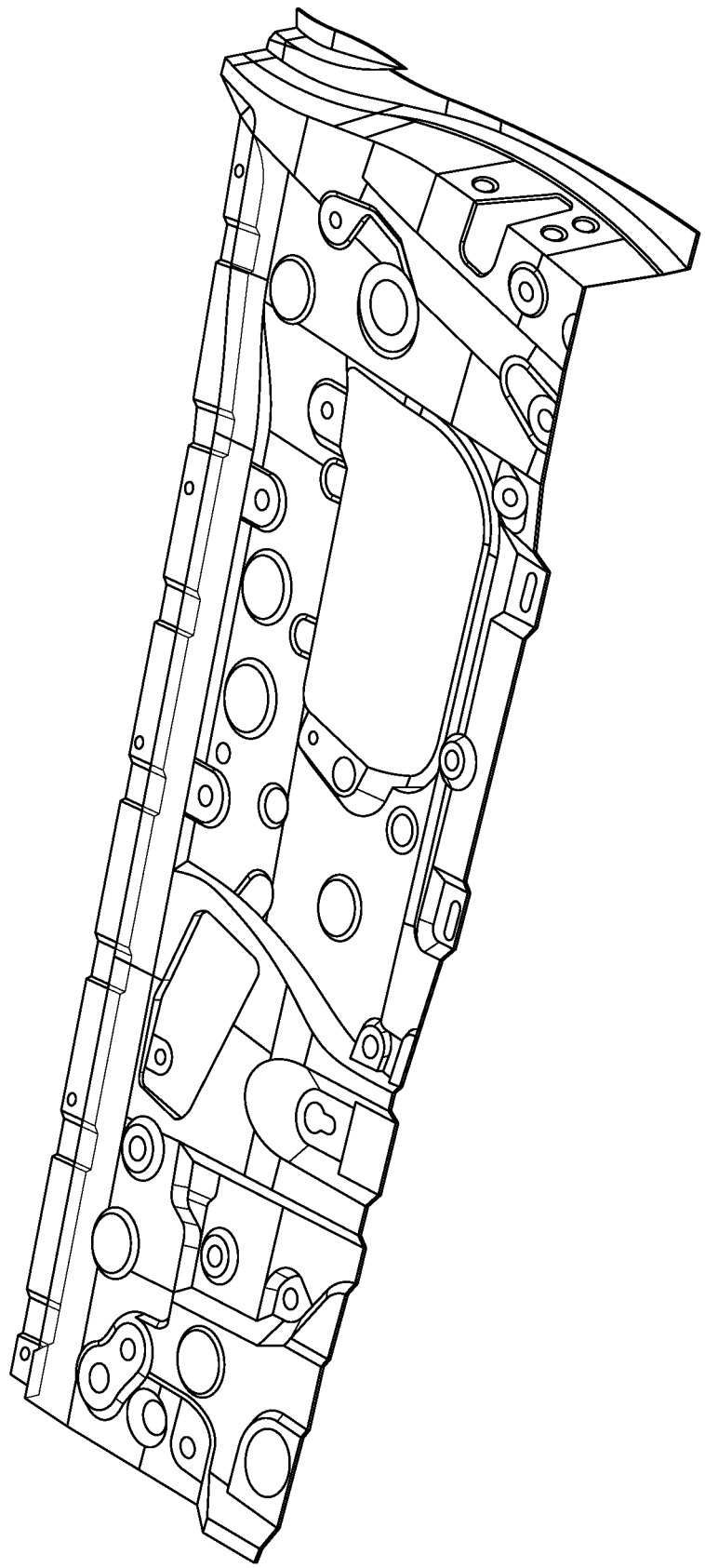
Figure 5:
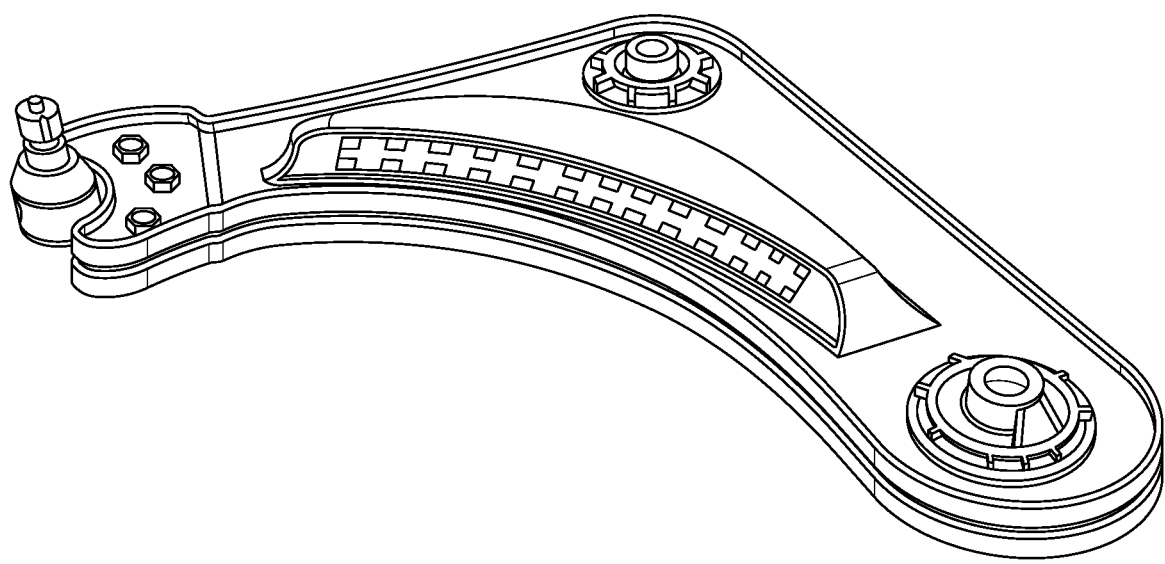
Figure 6:
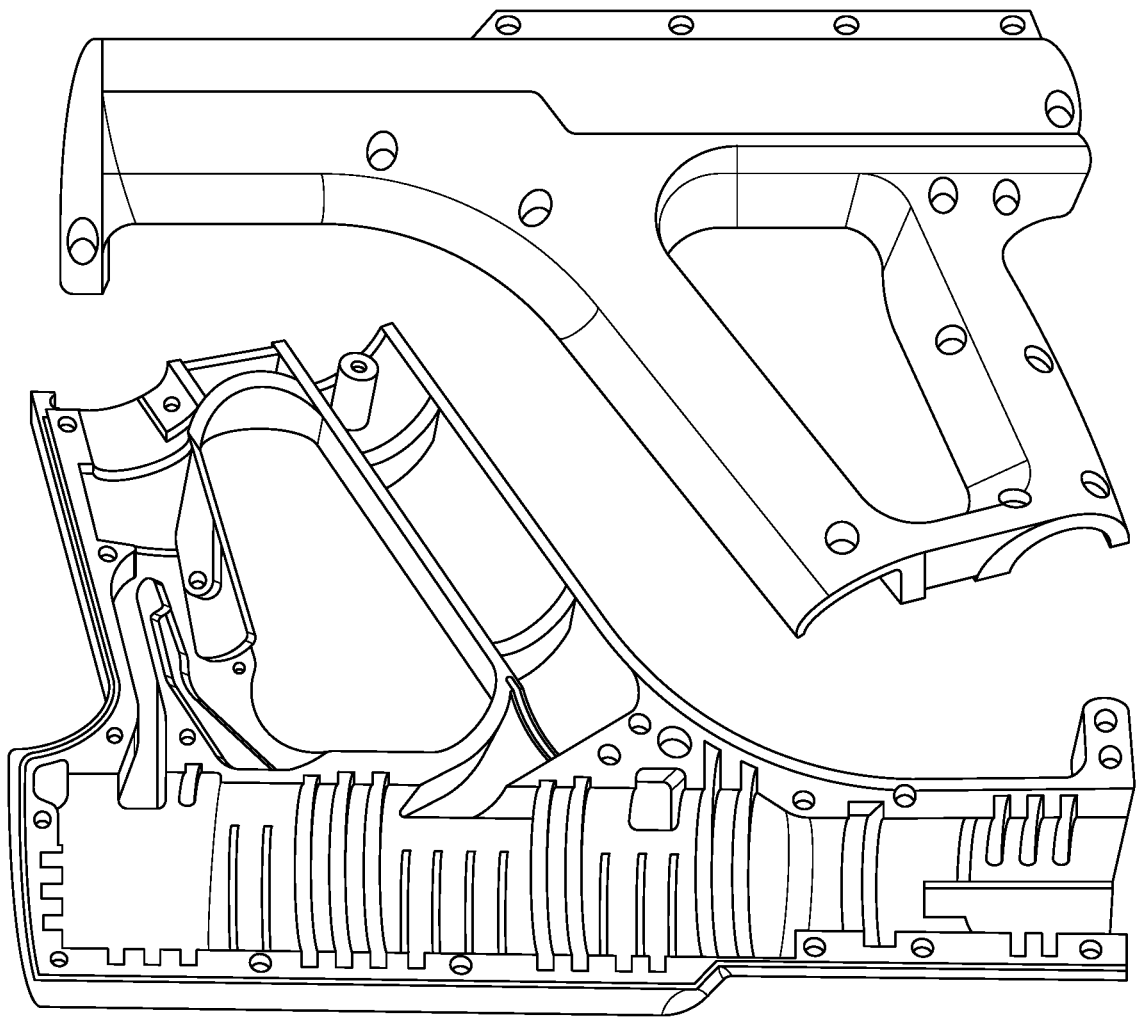
Figure 7:
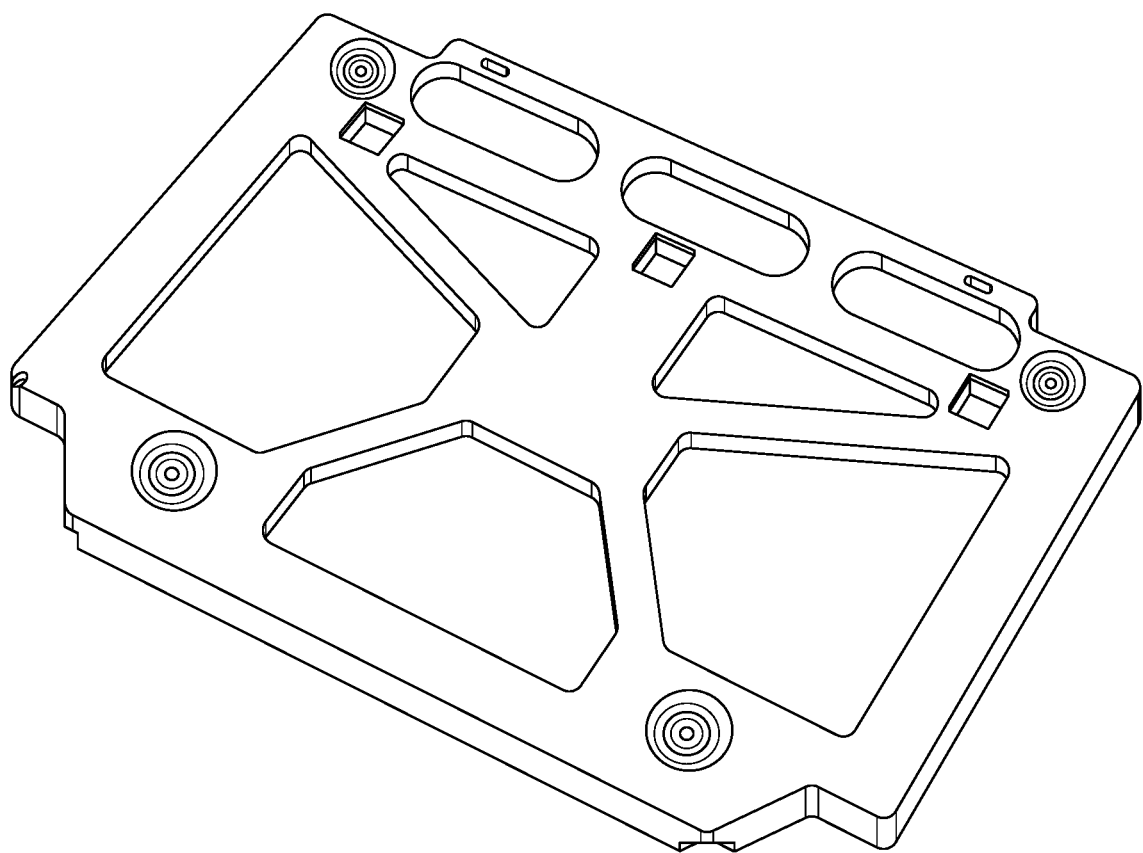

FIGS. 1-7 illustrate B-Rep skins representing mechanical parts which may be designed by the method. FIGS. 1-2 show B-Rep skins representing a half of a consumer goods product, namely a shampoo bottle. A user may design such a half including with the method, and then launch a symmetry operator to obtain the final bottle. FIGS. 3-4 show B-Rep skins representing automotive parts. FIGS. 5-7 show a B-Rep skin representing respectively a composite part, a plastic molded part and a stamped part.

Figure 8:
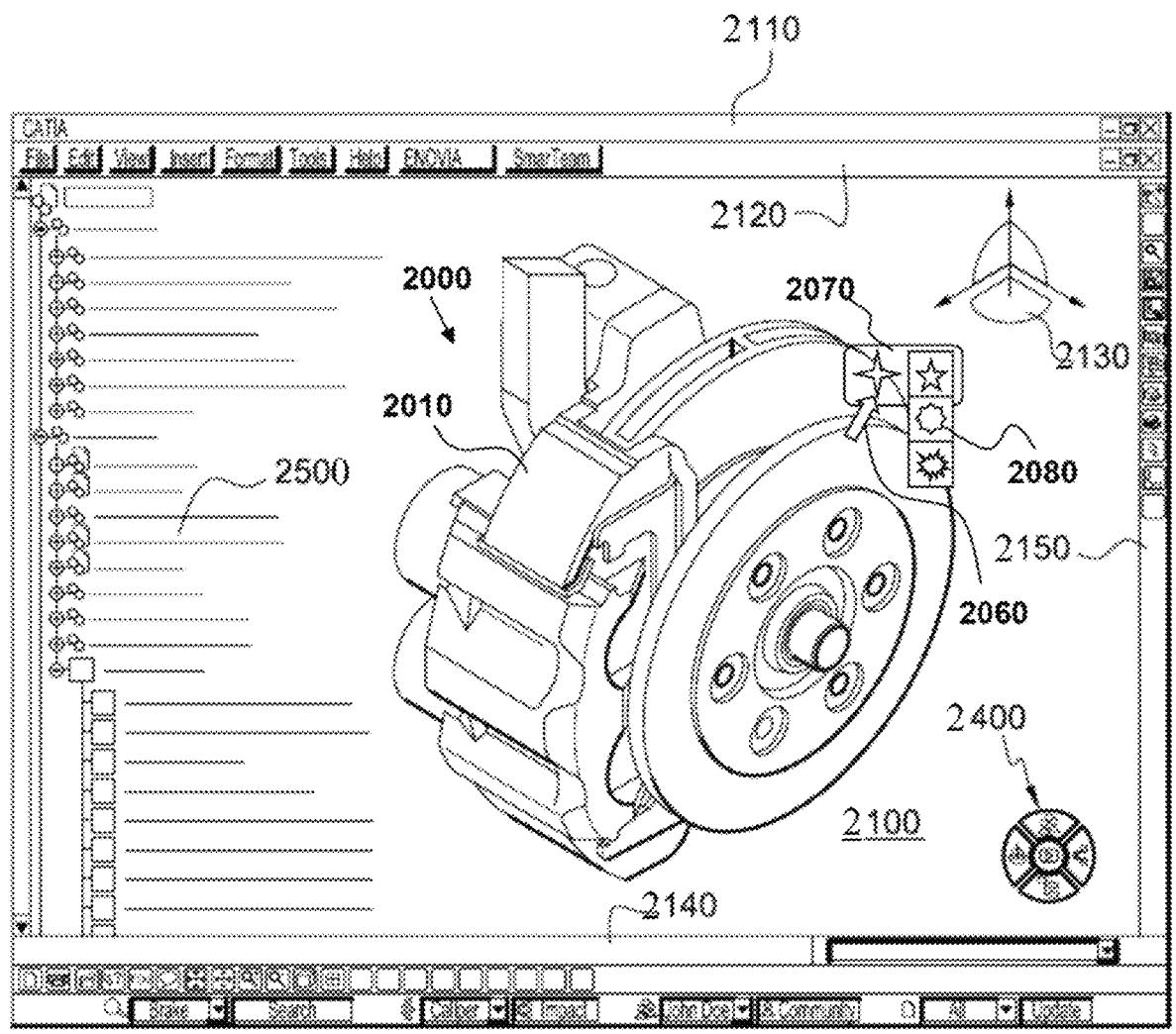
FIG. 8 shows an example of a graphical user interface of the system.

FIG. 8 shows an example of the GUI of the CAD system. The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of the figure, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 9:
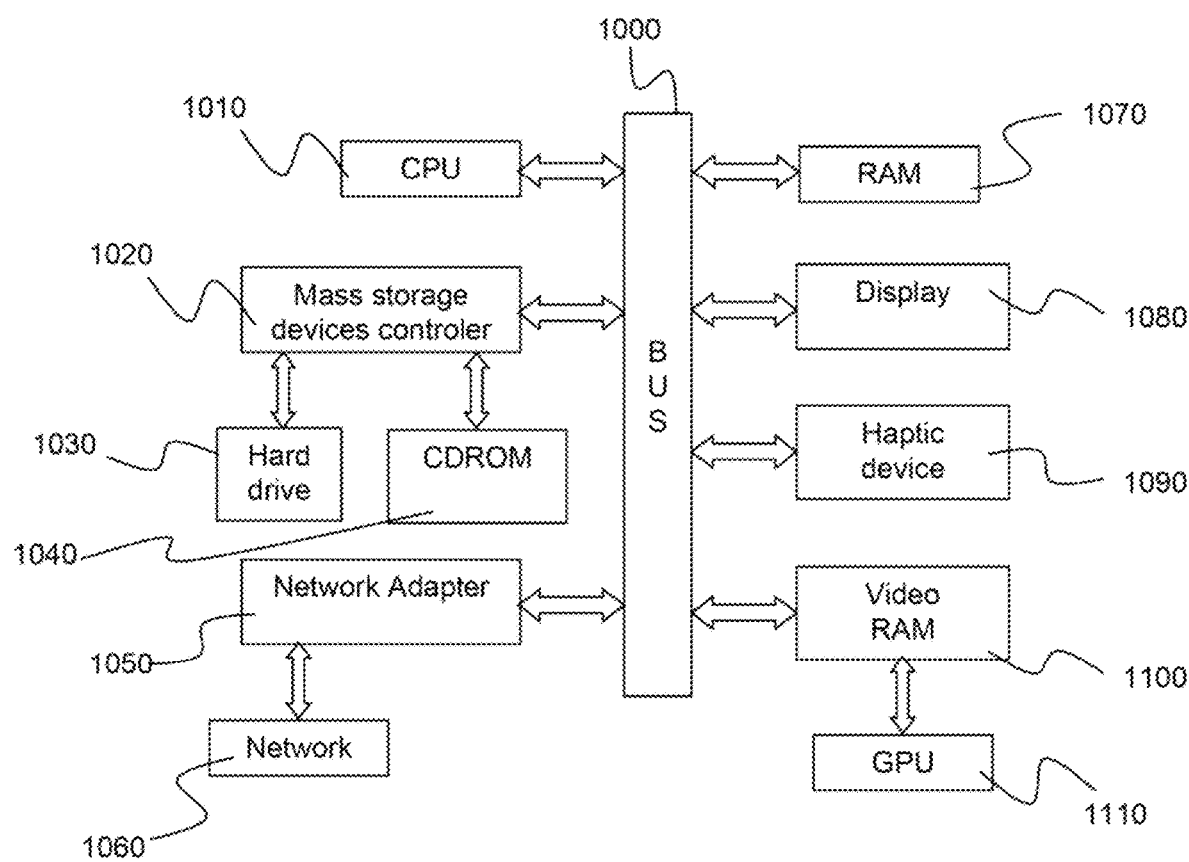
FIG. 9 shows an example of the system.

FIG. 9 shows an example of the system, wherein the system is a client computer system, e.g. a workstation of a user. The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The method may be included in a manufacturing process, which may comprise, after performing the method, producing a physical product corresponding in shape to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process. In examples, the 3D modeled object designed by the method may be inputted to a 3D printer which may 3D print the manufacturing object automatically.

Although the boundary representation (B-Rep) format and its concepts used by the method are widely known, they are now discussed.

A B-Rep model includes topological entities and geometrical entities. Topological entities are: face, edge, and vertex. Geometrical entities are 3D objects: surface, plane, curve, line, point.

By definition, a face is a bounded portion of a surface, named the supporting surface. An edge is a bounded portion of a curve, named the supporting curve. A vertex is a point in 3D space. They are related to each other's as follows. The bounded portion of a curve is defined by two points (the vertices) lying on the curve. The bounded portion of a surface is defined by its boundary, this boundary being a set of edges lying on the surface. Edges of the face's boundary are connected together by sharing vertices. Faces are connected together by sharing edges. By definition, two faces are adjacent at an edge if they share said edge. Similarly, two edges are adjacent if they share a vertex.

FIGS. 10-11 illustrate the B-Rep model of a cylindrical slot made of three faces: top planar face and two lateral cylindrical faces. FIG. 10 is the perspective view of the slot. Visible faces, edges and vertices are numbered. FIG. 11 is the exploded view of all faces. Duplicated numbers illustrate edges and vertices sharing. Face 1 is a bounded portion of a plane. Boundary of face one includes edges 4 and 5, each of them being bounded by vertices 10 and 11. They both have the same supporting circle. Face 2 is bounded by edges 6, 8, 5 and 13 all lying on an infinite cylindrical surface. Faces 1 and 2 are adjacent because they share edge 5. Faces 2 and 3 are adjacent because they share edges 8 and 13. Faces 1 and 3 are adjacent because they share edge 4.

FIG. 12 illustrates the "is bounded by" topological relationship of the B-Rep model. Nodes of higher layer are faces, nodes of intermediate layer are edges and nodes of lower layer are vertices.

FIGS. 13-14 illustrates the relationship between topological entities (faces, edges, vertices) and the supporting geometries (infinite cylinder, infinite plane, infinite line, points).

In the CAD system, the B-Rep model gathers in an appropriate data structure the "is bounded by" relationship, the relationship between topological entities and supporting geometries, and mathematical descriptions of supporting geometries.

Modeling volumes and skins is now discussed.

By definition, an internal edge of a B-Rep is shared by exactly two faces. By definition, a boundary edge is not shared, it bounds only one face. By definition, a boundary face is incident to at least one boundary edge.

A B-Rep is said to be closed if all its edges are internal edges. A B-Rep is said to be open is it includes at least one boundary edge. The example B-Rep of FIGS. 10-14 is open because edges 6 and 7 are boundary edges. Conversely, edges 4, 5, 8 and 13 are internal edges. A closed B-Rep is obtained from the example by adding disk-shape face 14 bounded by edges 6 and 7 as illustrated in FIGS. 15-16.

A closed B-Rep is used to model a 3D volume because it defines the inside portion of space enclosing material. An open B-Rep is used to model a 3D skin, which is a 3D object the thickness of which is sufficiently small to be neglected.

Application of the program (also referred to as "replace face" operation in the following) on B-Rep volumes is now discussed.

In the CAD industry virtual 3D objects are implemented through the B-Rep model. A very useful design operation is to replace a face of a given B-Rep by another face. This is an efficient way to locally change the shape of the 3D object. More precisely, it involves the B-Rep of the object being designed, a face of this B-Rep to be replaced and a replacing face. The replacing face does not belong to the B-Rep of the 3D object. The goal is for the CAD system to merge the replacing face to the B-Rep, as illustrated in FIG. 17.

From the algorithm point of view, in a first step, the system may remove the face to be replaced from the B-Rep, thus creating a void as illustrated by left drawing in FIG. 18. In a second step, adjacent faces of the (removed) replaced faces may be extrapolated as long as necessary, as illustrated by center drawing in FIG. 18. If needed, the replacing face may be extrapolated as well, so that the trimming is possible, as illustrated in right drawing in FIG. 18. In a last step, the replacing face may be trimmed and merged to the B-Rep, which yields the updated shape of the 3D object.

A critical step of this "replace face" operation is the merging step. When the 3D object is a volume, it is modeled by a closed B-Rep, meaning no boundary edges. In particular, the replaced face is everywhere surrounded by adjacent faces. When used for trimming, these (extrapolated) adjacent faces provide a non-ambiguous result, as illustrated by right drawing in FIG. 18. This is because the intersection between the extrapolated faces and the replacing face features a closed loop, which defines the portion to keep and the portion to discard, as illustrated in FIG. 19.

When the 3D object is a skin, it is modeled by a B-Rep featuring boundary edges. If the replaced face is a boundary face, some of its boundary edges are not shared by any adjacent face, as illustrated in left drawing of FIG. 20. After the replaced face is removed from the B-Rep (center drawing in FIG. 20), and the adjacent faces are extrapolated (right drawing in FIG. 20), the geometry available for trimming the replacing face is unsatisfactory.

This is because the intersection between extrapolated faces and the replacing face is an open curve, which does not define any portion to keep, as illustrated in FIGS. 21-22.

This makes the "replace face" algorithm designed for volumes, inoperative to change the shape of a boundary face of a skin if not adapted to this specific situation. The method provides such adaptation and restores the closed B-Rep situation for merging the replacing face in a skin. This is done by creating the one or more second faces each adjacent to the boundary face and bounded by a respective boundary edge of the B-rep skin. Such creating may in later-discussed examples be performed by computing an intermediate volume through an offset of the initial skin. The "replace face" operation may be performed on the intermediate volume, and the resulting volume includes the expected shape, from which the resulting skin may be extracted.

The method thus extends the design capability of the CAD system by providing a "replace face" operation indifferently working with volumes and skins. This shortens the design time by avoiding tedious manual solutions. Furthermore, it is noticeable that in examples the method makes use of high-level algorithms: thickening of a skin and "replace face" on a volume. This provides the method of these examples with an easy and reliable programming because these algorithms may exist independently in the geometric modeling library of the CAD system.

Industrial tests show that the geometry provided by the method is particularly adapted to further design of the modeled object: trimming, merging with other skin models.

Figure 23:
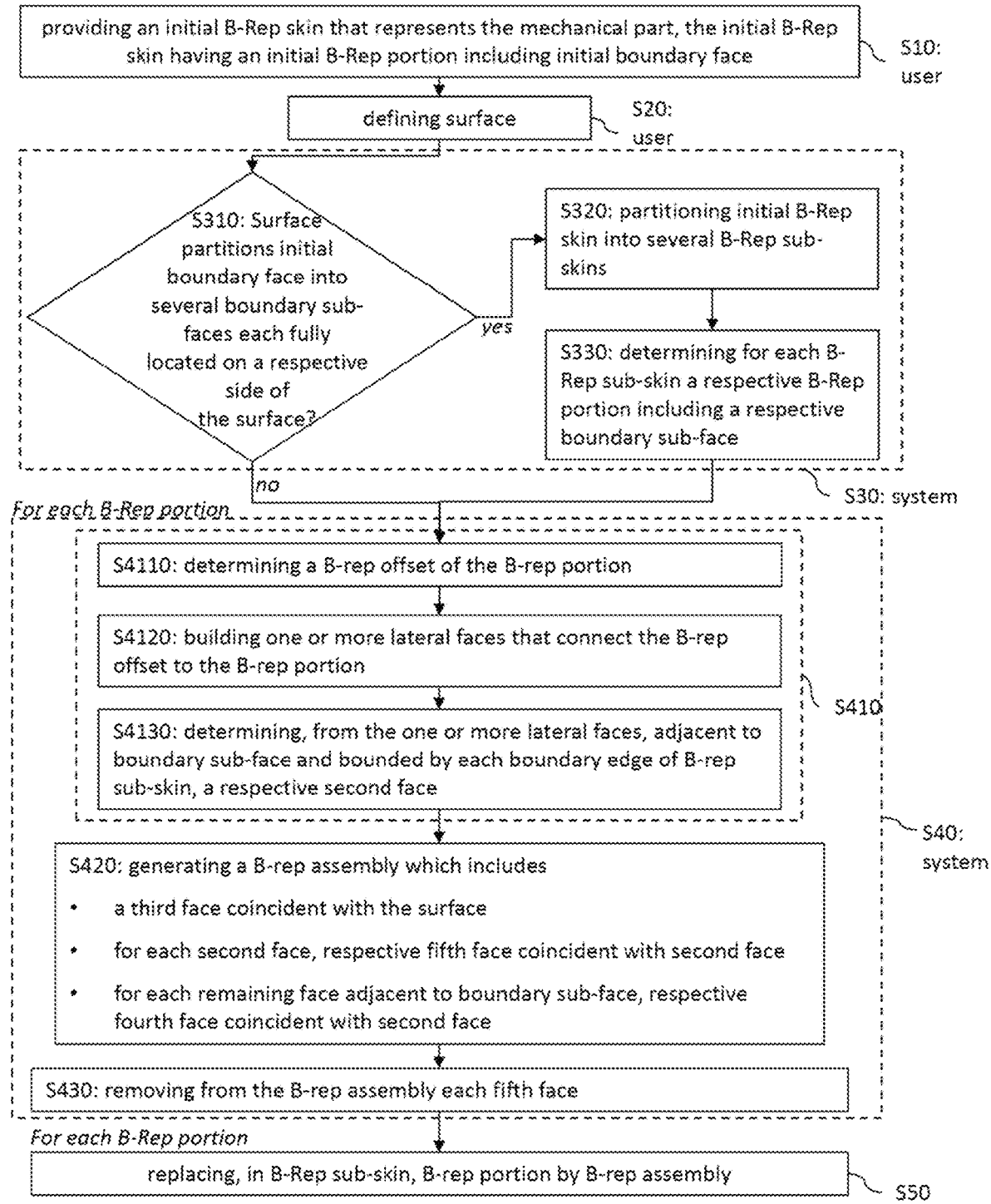
FIG. 23 shows a flowchart of an example of the method.

An example of the method is now discussed referring to FIG. 23.

The method starts with providing S10 an initial B-Rep skin that represents a part or a whole of a mechanical part. The providing S10 is performed in the example via user-interaction, for example by the user designing a B-Rep. In other examples the initial B-Rep may be provided already-designed, for example retrieved in a memory or received from a distant computer.

The method then comprises defining S20 a surface by graphical user-interaction with the CAD system, for example after the user launching a "replace face" operation. The surface may be bounded. For example, the surface may be defined by the user as one or more connected faces under the B-Rep format. The surface may alternatively be not bounded. For example, the user may define a surface without specifying boundaries, such as a canonical surface, a procedural surface, or a NURBS, or the user may define a face but the system may only consider the supporting surface for the purpose of running the algorithm.

In examples, the user may further specify at least one face of the initial B-Rep skin to be replaced based on the surface within the "replace face" operation, e.g. before or after the defining S20. In alternative examples, the CAD system may automatically identify the at least one face of the B-Rep intended to be replaced, for example as the at least one face having a smallest distance from the defined surface and/or meeting any other criterion.

The at least one face may consist of one single face or alternatively comprise several adjacent faces (e.g. forming a "supra-face", i.e. an assembly of connected faces). The following discussion focuses on the case where the at least one face consists of an initial boundary face of the initial B-rep skin, that is, a face bounded by one or more initial boundary edges of the initial B-rep skin, it is however noted that the algorithm may apply to any other input face or group of faces.

The initial boundary face is one that forms an initial B-Rep portion with one or more first faces each adjacent to the initial boundary face at a respective initial internal edge of the initial B-rep skin. By "B-Rep portion", it is merely meant a portion of the B-Rep skin which presents the B-Rep format. The first faces may be identified automatically by the CAD system, e.g. if needed (i.e. depending on the result of S310). In other words, the method may automatically determine the B-Rep portion.

The method of the example then comprises a scheme S30 performed automatically by the system for providing one or more B-Rep (sub-)skins each with a respective B-Rep portion to be processed independently by later steps S40 and S50 the algorithm. Scheme S30 allows processing faces to be replaced at S40 and S50 which are always fully located on one respective side of the surface (i.e. not intersected by the surface). This provides robustness to the method. However, scheme S30 is optional. The method may indeed either directly go to S40 after S20, or alternatively the situation contemplated by scheme S30 and tested at S310 may be forbidden.

Scheme S30 comprises testing S310 whether the surface defined at S20 partitions said initial boundary face into several sub-faces (referred to as "boundary" sub-faces). By "partition", it is meant that the surface intersects the initial boundary face and the intersections divides the initial boundary face into several parts each fully located on a respective side of the surface.

The testing S310 may yield a negative result, which means that the surface does not intersect the initial boundary face, such that the algorithm may go to S40 using as a single input the untouched (i.e. not partitioned) initial B-Rep portion of the initial B-Rep skin.

The testing S310 may however alternatively yield a positive result, in which case the method partitions S320 the initial B-Rep skin into several B-Rep sub-skins (i.e. which are merely B-Rep skins forming parts of the initial B-Rep skin) according to the way the surface partitions the initial boundary face (i.e. using the same dividing positions of the partitioning tested at S310). The method then determines S330 for each such B-Rep sub-skin a respective B-Rep portion including a respective boundary sub-face (i.e. a part of the initial boundary face) bounded by one or more boundary edges of said B-Rep sub-skin, the boundary sub-face being fully located on a respective side of the surface. In such a case, the constructing S40 and the replacing S50 is performed for each B-Rep sub-skin relative to its respective B-Rep portion. In other words, each B-Rep sub-skin, its respective B-Rep portion, and the respective boundary face of the B-Rep portion (sub-face of the initial boundary face) is inputted to S40 and S50 for an independent (e.g. parallel) processing. After S40 and S50 are performed independently, the resulting/updated/modified B-Rep sub-skins may be joined or sewn together (e.g. automatically).

The method performs after S30 the constructing S40 (automatically) and the replacing S50 (automatically and/or after user-validation) of the B-Rep portion of each B-Rep sub-skin or of the B-Rep portion of the initial B-Rep skin (depending on the result of the testing S310). In the following description of the method of the example, a single run of the constructing S40 and of the replacing S50 is discussed, and the term "sub" is removed when referring to the B-Rep sub-skins, sub-portions and boundary sub-faces.

The constructing S40 of a B-rep replacement for an input B-Rep portion of an input B-Rep skin includes creating S410 one or more second faces each adjacent to the boundary face and bounded by a respective boundary edge of the B-rep skin. In examples, for each boundary edge of the B-rep skin (where the boundary face is adjacent to no first face), one or more second faces are created such that the boundary face is surrounded by (first and second faces), i.e. the boundary face having no free edge anymore.

The creating S410 may comprise thickening the B-rep portion, for example in a direction opposite to the surface (since the face is fully located on one side of the surface, the thickening may be performed in the direction defined from the surface toward the face, such that the thickening yields a volume which does not intersect the surface whichever the situation). This provides a result eventually consistent from the mechanical point of view and in a robust manner.

The thickening comprises in the example determining S4110 a B-rep offset of the B-rep portion (which is merely an offset of the B-rep portion presenting the B-Rep format), building S4120 one or more lateral faces that connect the B-rep offset to the B-rep portion. The one or more second faces may be determined S4130 from the one or more lateral faces, for example as the minimal set of lateral faces necessary such that the boundary faces presents no free edge. In examples one or more lateral faces may be built at S4120 such that the B-Rep portion which formed an open B-Rep skin by itself now forms a closed B-Rep volume with the B-Rep offset and the one or more lateral faces. In other examples, the thickening determined an offset of the whole B-Rep skin, such that the closed volume is formed by B-Rep skin, the offset thereof, and the one or more lateral faces.

After the thickening, the method comprises generating S420 a B-rep assembly which is to replace the B-Rep portion. The B-Rep assembly is merely a patch presenting the B-Rep skin format, which presents a geometry partly identical to the surface, and which can be sewn smoothly to the B-Rep skin when it replaces the B-Rep portion therein, so as to yield a mechanically consistent result in accordance with user-intent.

The B-Rep assembly includes one or more third faces (e.g. one single third face) each coincident with the surface (i.e. at least part of each third face geometrically lies on the surface), where each third face has one or more edges, and each edge of each third face is eventually internal to the B-rep assembly. The B-Rep assembly further includes one or more fourth faces each coincident with a respective first face (i.e. at least part of each fourth face geometrically lies on the supporting surface of a respective first face) and adjacent to a respective third face, and one or more fifth faces each coincident with a respective second face (i.e. at least part of each fifth face geometrically lies on the supporting surface of a respective second face) and adjacent to a respective third face. In other words, the B-Rep assembly presents the same topology or general shape as the B-Rep portion augmented by the one or more second faces, but part of it is geometrically coincident with the surface and part of it is geometrically coincident with the ring of first and second faces arranged all around the input face to be replaced (which was initially a boundary face).

In examples, the generating S420 comprises producing one or more third faces each by extrapolating and/or trimming the surface, one or more fourth faces each by extrapolating and/or trimming a supporting surface of the respective first face, and/or one or more fifth faces each by extrapolating and/or trimming a supporting surface of the respective second face. If the surface is defined bounded and not large enough to be trimmed by the fourth and fifth faces, the surface may be extrapolated for such trimming to be possible. Similarly, if the first and second faces are not large enough for the surface to trim them, they may be extrapolated for that. The generating S420 thus performs an interpolation of the first, second and third faces, as illustrated earlier with reference to FIGS. 17-19.

In examples, from the user-experience point of view, the surface is defined by the user as a new face in replacement of an existing face of the B-Rep skin. The new face is generally similar to the existing face in terms of general dimensions, and the new face is positioned either fully separated from the existing face and generally parallel, either intersecting the existing face along a single curve (thus partitioning the existing face in only two sub-faces). Indeed, the "replace face" operation may as known from the technical field of CAD design be used to perform slight adjustments to a generally acceptable topology. The new face may be dimensioned and positioned in such a way that the extrapolation(s) and trimming(s) yield (once the replacement is performed) a topology identical to the initial topology of the B-Rep skin around the face to be replaced. This is all illustrated earlier with reference to FIGS. 17-21.

The method then comprises removing S430 from the B-rep assembly each fifth face, such that the B-Rep assembly presents the same topology or general shape as the B-Rep portion without the one or more second faces. This allows respecting the initial topology.

Eventually, the method comprises replacing S50, in the B-Rep skin, the B-rep portion by the B-rep replacement, for example upon user-validation.

In examples, from the user-interaction point of view, the "replace face" operation may be particularly simple. (1) select solid or skin (2) on the selected solid or skin, select replaced face(s) (3) select replacing surface (4) push OK button. The alternative without such an operation would be to cut and assemble manually pieces of surfaces, which is not only long and tedious, but more importantly which is quickly rendered unstable in the case of an a posteriori modification and an update. The caption of the "replace face" operation in a single feature allows editing it afterwards and to highlight it in a significantly more stable manner.

Implementations of the method are now discussed.

The "thickening" operation on skins is discussed.

Figure 24:
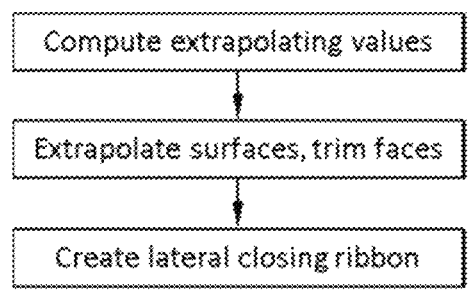
FIGS. 24, 25, 26, 27, 28, 29, 30, 31, 32, 33, 34, 35, 36, 37, 38, 39, 40, 41, 42, 43, 44, 45, 46 and 47 illustrate the method.

The method makes use of the so-called "thickening" operation on a skin. From the designer point of view, this operation changes a zero-thickness 3D object modeled by a skin into a thick (but thin) object modeled by a volume. The thickness value is user defined. The principle is to compute an offset of the input skin. In the context of the method, this offset is directed on one side of the input skin. The main steps of the thickening algorithm may be as shown on FIG. 24.

In other words, the one or more lateral faces may include one or more lateral ribbon faces. Each lateral ribbon face may be bounded by a respective boundary edge of the B-rep portion and a corresponding boundary edge of the B-rep offset. In such a case, each lateral ribbon face adjacent to the boundary face and bounded by a respective boundary edge of the B-rep skin may form a respective second face.

In examples, each lateral ribbon face forming a respective second face may be supported by a ruled surface. This allows creating one or more second faces at S410 which are relevant from the mechanical point of view, eventually leading to a result (after the replacing S50) which is thus relevant from the mechanical point of view. An example for performing this is now discussed.

Offset Surface Definition

From the mathematical point of view, given a face F of the input skin, given S its supporting surface, and given δ the offset value, the supporting surface $\tilde{S}$ of the offset face is defined by $$\tilde{S}(u, v) = S(u, v) + \delta N(u, v) \text{ where } N(u, v) = \frac{S_u(u, v) \times S_v(u, v)}{\|S_u(u, v) \times S_v(u, v)\|}$$

is the normal vector of surface S.

Extrapolation Values

Figure 25:
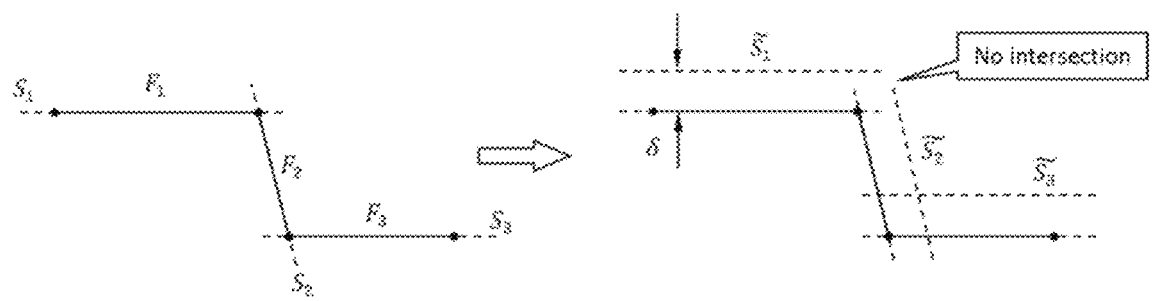

The first step computes extrapolation values for input surfaces in order to prevent gaps separating offset surfaces. The issue is that offset surfaces of input adjacent faces may be separated or may intersect, depending on the offset value and their relative positions. FIG. 25 illustrates a skin made of three adjacent faces $F_1$, $F_2$, $F_3$ sharing sharp edges. Offsetting their respective supporting surfaces $S_1$, $S_2$, $S_3$ into surfaces $\tilde{S}_1$, $\tilde{S}_2$, $\tilde{S}_3$ yields a situation where surfaces $\tilde{S}_2$ and $\tilde{S}_3$ intersect while surfaces $\tilde{S}_1$ and $\tilde{S}_2$ are separated, which makes further trimming of corresponding offset faces and $\tilde{F}_1$ and $\tilde{F}_2$ questionable.

Figure 26:
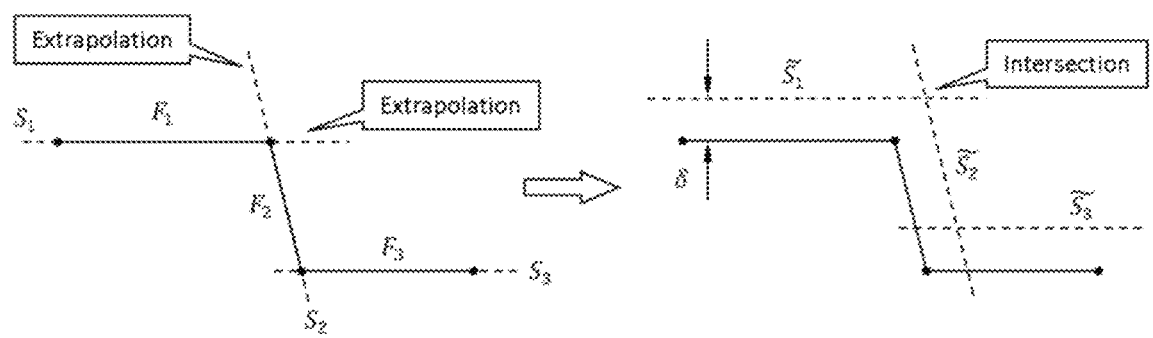

This issue is solved by extrapolating surfaces $S_1$ and $S_2$ in such a way that the respective offset surfaces intersect. The extrapolation value is $\alpha\delta$ where $\alpha$ is the maximum angle between the normal vectors of faces $F_1$ and $F_2$ measured along the shared edge. FIG. 26 illustrates appropriate extrapolation of surfaces $S_1$ and $S_2$ yielding intersecting offset surfaces $\tilde{S}_1$ and $\tilde{S}_2$.

Computing the Parallel Skin

The second step is to compute the offset skin by using offset (extrapolated) surfaces of the input skin and by trimming offset faces. After this step, the geometry and the topology of the parallel skin is known, as shown on FIGS. 27-28.

Boundary Vertex Offset

Figure 27:
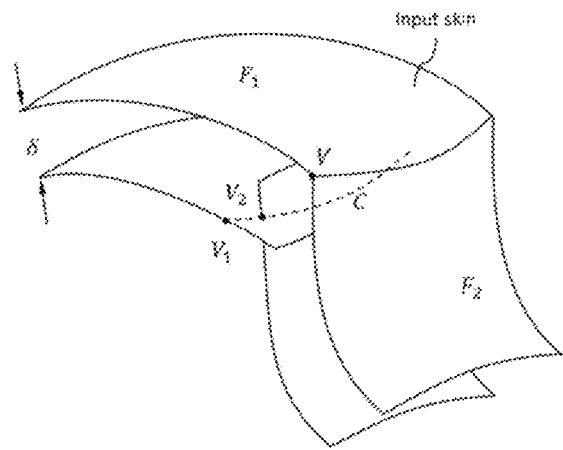
Figure 28:
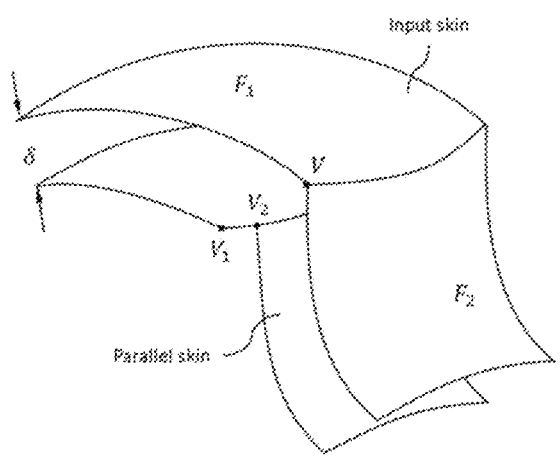

A boundary vertex of a skin is generally shared by only two faces. Let $F_1$ and $F_2$ be the faces incident to the boundary vertex V. Consider the respective offset surfaces $\tilde{S}_1$ and $\tilde{S}_2$ of supporting surfaces $S_1$ and $A_2$ and their intersection curve C. By nature, this curve intersects the offset boundary curves of faces $F_1$ and $F_2$ at points $V_1$ and $V_2$, as illustrated in FIGS. 27-28.

Figure 29:
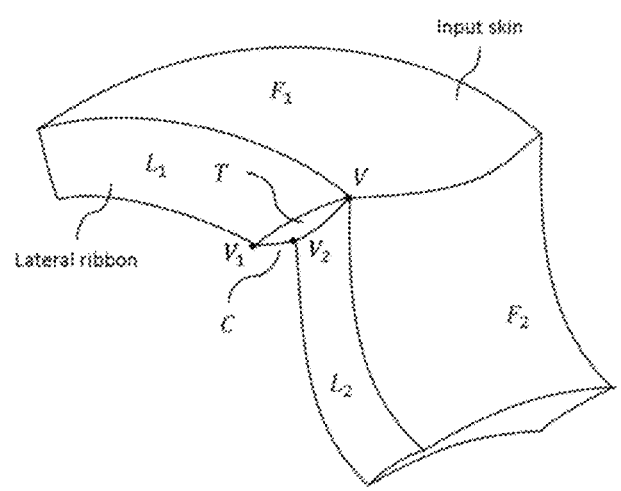

The lateral ribbon faces are made of face $L_1$ built of the boundary curve of face $F_1$, of face $L_2$ built of the boundary curve of face $F_2$ and the triangular face T built with vertices V, $V_1$ and $V_2$ and connecting ribbon faces $L_1$ and $L_2$, as illustrated in FIG. 29.

Geometry of the Lateral Ribbon Surface

The closing ribbon connects the boundary of the input skin and the boundary of its parallel skin. Noting $w \mapsto (u(w),v(w))$ a boundary edge of the input skin defined on its supporting surface S, the corresponding boundary 3D curve is $w \mapsto S(u(w),v(w))$. The corresponding boundary curve of the parallel skin is $$w \mapsto S(u(w),v(w)) + \delta N(u(w),v(w))$$

So, the ribbon surface connecting these two boundary curves is the ruled surface $(w,t) \mapsto L(w,t)$ where $t \in [0,1]$ and $$L(w,t) = S(u(w),v(w)) + t\delta N(u(w),v(w))$$

Figure 30:
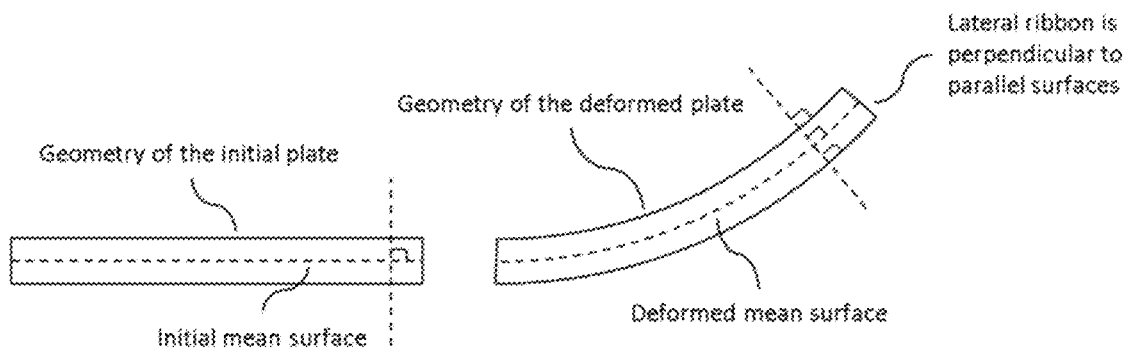

The geometry of such a lateral ribbon surface is compliant with the theory of plates, defined for example in "K. D. Hjelmstad, *Fundamentals of Structural Mechanics*, Springer, 2005". Indeed, a typical industrial part designed in a CAD system by using the method is to be manufactured by bending or stamping an initial planar sheet, which is typically a thin plate. According to the theory of plates, a line that is perpendicular to the mean surface of the initial plate is changed by the deformation into a line that is perpendicular to the reference surface of the deformed plate. This characteristic is precisely captured in the examples of the method by using the surface normal N in previous definition of the ribbon lateral surface, as illustrated in FIG. 30. This is because the normal vector of the reference surface is also the normal vector of any surface parallel to the reference surface. Indeed, for any real number δ the tangent plane of the parallel surface is generated by vectors $\tilde{S}_u = S_u + \delta N_u$ and $\tilde{S}_v = S_v + \delta N_v$. They are both perpendicular to the normal vector N of the initial surface S. Firstly, $\langle \tilde{S}_u, N \rangle = \langle S_u + \delta N_u, N \rangle + \langle S_u, N \rangle + \delta \langle N_u, N \rangle$. Then $\langle S_u, N \rangle = 0$ by definition of N and $\langle N_u, N \rangle = 0$ because $\|N(u,v)\|^2 = 1$ for all u,v so $$0 = \frac{\partial}{\partial u} \|N(u,v)\|^2 = 2\langle N_u, N \rangle.$$

Same for $S_v$. This means that the geometry of the lateral ribbon surface is the one of a deformed plate, as illustrated in FIG. 30.

Such examples of the method thus provide a particularly accurate result when the mechanical part comprises a bent and/or stamped planar sheet. Indeed, when the B-Rep portion represents a portion of such sheet, the creating S410 is consistent with the true shape of the mechanical part. But these examples of the method also provide a good approximation in the case of molded parts such as plastic molded parts or composite parts.

Examples of surface extrapolation which may be implemented at S420 and/or at S4110 are now discussed. The extrapolation strategy depends in these examples on the nature of the input surface: canonical surface, procedural surface or free form surface.

Canonical surfaces are: plane, sphere, cylinder, cone, torus. They are extrapolated by extending the [a,b]×[c,d] domain as long as the normal vector is well defined. For example, a conical surface should rather not be extrapolated beyond its apex.

Procedural surfaces are defined by sweeping a planar profile according to a 3D motion, the 3D motion being defined by guiding elements. Procedural surfaces are extruded surfaces, revolute surfaces, ruled surfaces and complex swept surfaces. An extruded surface is a profile swept along a line segment. A revolute surface is a profile rotated around an axis. A ruled surface $(w,t) \mapsto R(w,t)$ is the motion of a line segment guided by two curves $R(w,t) = C_1(w) + t(C_2(w) - C_1(w))$ or by the normal field of a surface, like the lateral ribbon surface $L(w,t) = S(u(w),v(w)) + t\delta N(u(w),v(w))$ previously defined.

Figure 31:
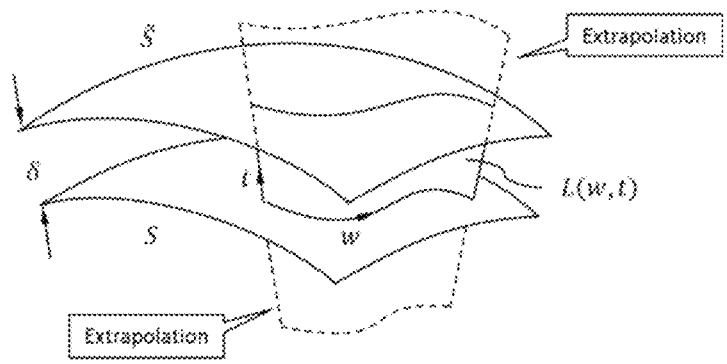

The lateral ribbon surface is easily extrapolated in the t direction by extending interval [0,1] as illustrated in FIG. 31.

A complex swept surface is a moving profile guided by a spine curve and other elements (curves or surfaces). A procedural surface is extrapolated through two is steps. Firstly, input elements (definition interval, profile, extrusion line, revolute angle, spine curve, guiding elements) are extrapolated and, secondly, the swept surface is recomputed from its new inputs. In particular, extrapolating a ruled surface in its linear direction t (according to previous notation) is to extend the corresponding interval definition. This process guarantees that the extrapolation of a ruled surface is another ruled surface.

A typical free form surface is a NURBS surface defined by a grid of control points. It can be extrapolated by adding control points, as defined in L. Piegl, W. Tiller, *The NURBS book*, Springer 1996, in such a way that the input surface is unchanged and that the matching with the initial NURBS surface is curvature continuous.

Faces Classification

Figure 32:
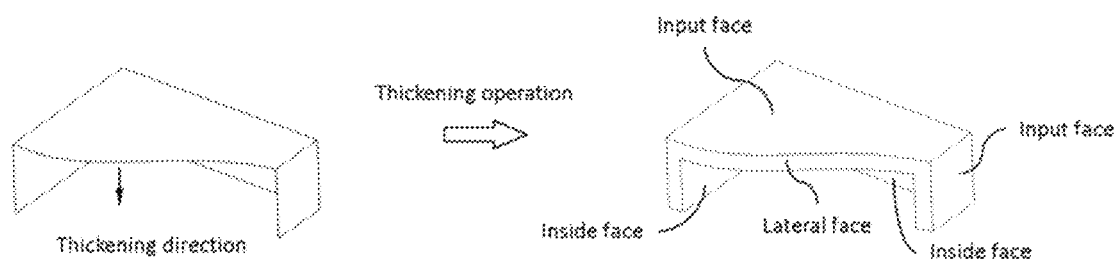

Once the thickening operation is done, the B-Rep of the resulting volume includes three types of faces: the faces of the input skin, named input faces, the new faces adjacent to an input face, named lateral faces (created at step three of the thickening algorithm), and all other faces, named inside faces (created at step two of the thickening algorithm). FIG. 32 exemplifies the input skin, the resulting thick volume and all types of faces.

Lateral faces and inside faces are collectively named extra faces because they are created by the thickening operation.

An algorithm for the non-intersecting situation is now presented.

Figure 33:
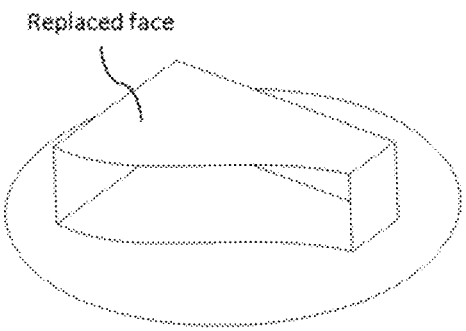
Figure 34:
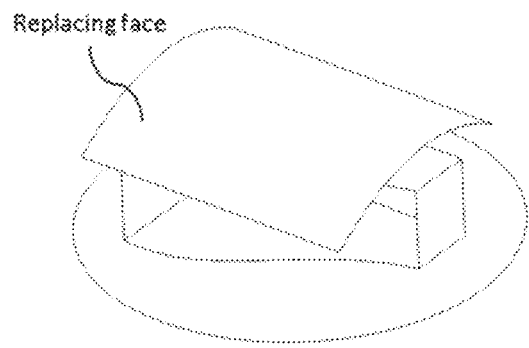

The principle of the method is to use a "replace face" operation adapted for volumes in the context of skins. Input data are the skin, the user selected replaced face of the skin and the user selected replacing face, as illustrated in FIGS. 33-34. For clarity, the algorithm is firstly described in the situation where the replacing face does not intersect the replaced face. The intersecting situation is described in a further section. The system performs the following steps.

Figure 35:
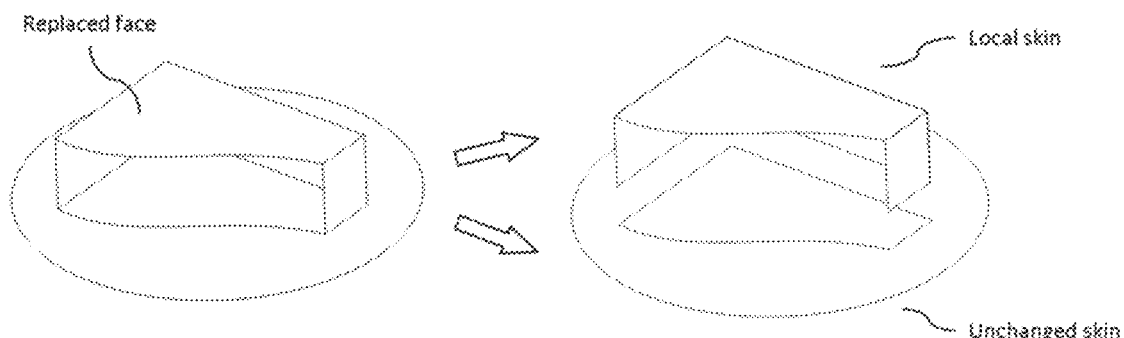

Step 1 is to separate the unchanged portion of the input skin. This is done by keeping the replaced face and all its adjacent faces in the data structure, named the local input skin. Other faces, if any, are unchanged by the operation. They are named unchanged skin and stored to be reused at step 5. This makes the thickening operation of step 2 safer by only involving relevant faces. The risk of thickening failure on some unchanged face is avoided. This is illustrated by FIG. 35.

Figure 36:
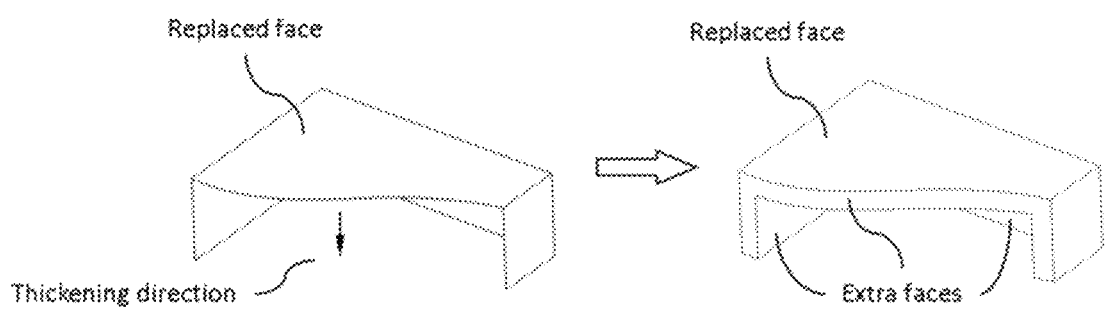

Step 2 is to create a volume by thickening the local input skin resulting from step 1. The thickness is directed toward the side of the skin that is opposite to the replacing face. The thickness value is small enough so that the operation is successful. A typical value is above 0.1 mm or 0.2 mm and/or below 2 mm or 1 mm, for example 0.5 mm. For clarity, illustrations feature a larger thickness value. Extra faces resulting from the thickening are appropriately flagged for further management. This step makes use of the thickening algorithm. This is illustrated by FIG. 36.

Figure 37:
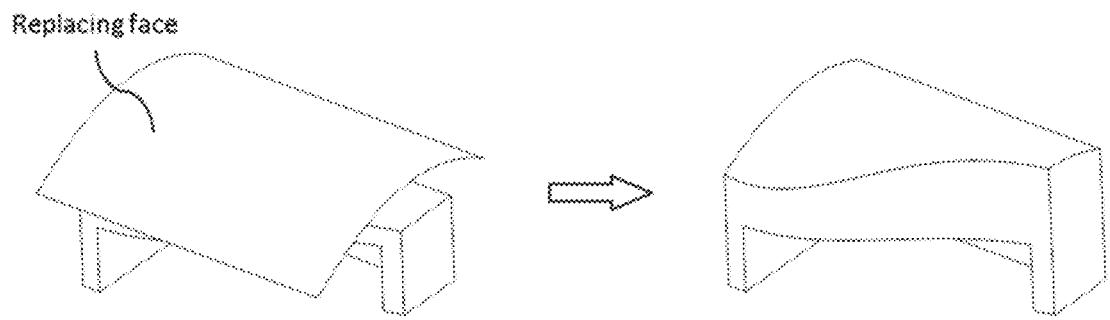

Step 3 is to perform the "replace face" operation on the volume computed at the previous step. This step makes use of the existing "replace face" algorithm. This is illustrated by FIG. 37.

Figure 38:
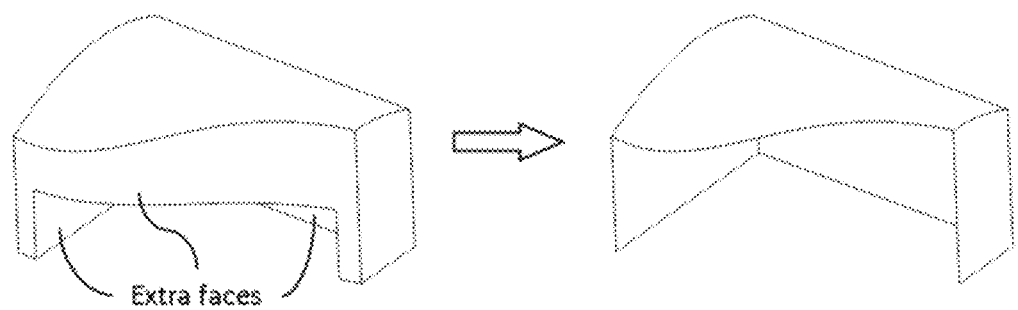

Step 4 is to remove faces that where flagged (at step 2) as extra faces added by the thickening operation. The resulting skin is the local shape of the result. This is illustrated by FIG. 38.

Figure 39:
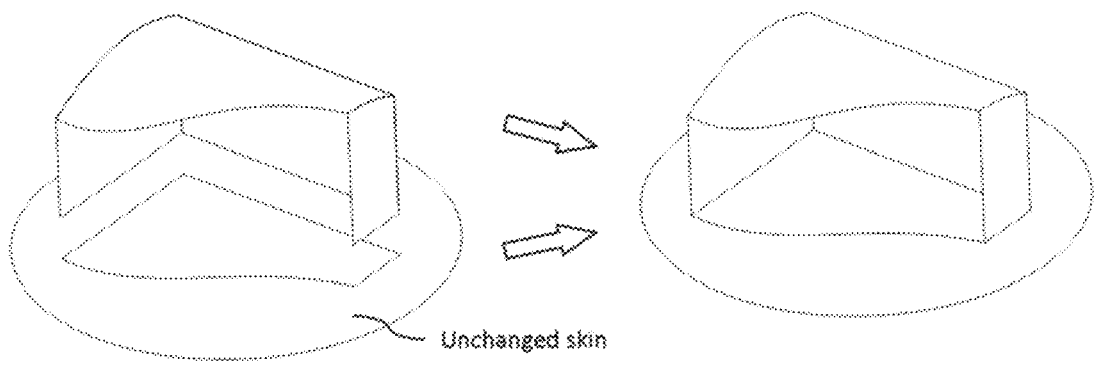

Step 5 is to join the unchanged skin (extracted at step 1) and the local resulting skin extracted at step 4, which yields the resulting skin. The joining operation is logical rewriting with the " . . . is bounded by . . . " topological relationships. No geometrical computation is involved. This is illustrated by FIG. 39.

Figure 40:
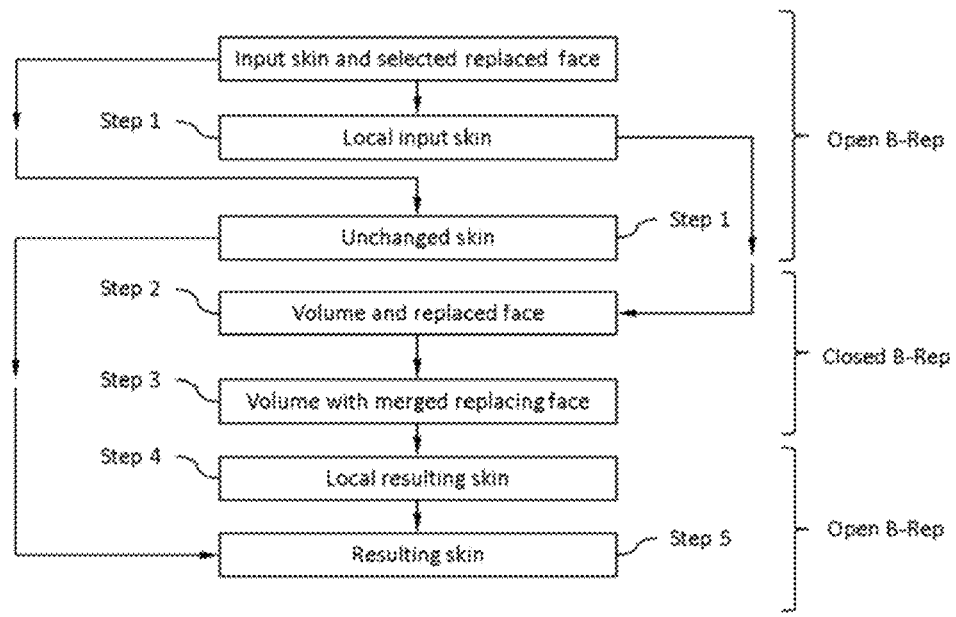

All steps of the algorithm (non-intersecting situation) are gathered in the diagram of FIG. 40.

An algorithm for the intersecting situation is now presented.

The complex situation is now discussed. When the replacing face intersects the replaced face, the thickening direction of step 2 is undefined because the replacing face is located on both sides of the replaced face. In this case, the solution is to use the replacing face to split the local input skin obtained at step 1. This yields at least two partial local input skins, each of them featuring a partial replaced face. By design, each partial replaced face is located on one side of the replacing face. Then, the previous algorithm is run on each partial local input skin which yields as many partial local resulting skins. The local resulting skin is obtained by joining together all partial local resulting skins.

Figure 41:
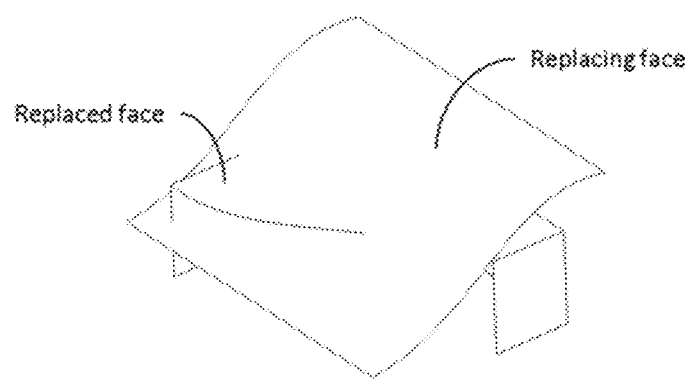

The algorithm is now exemplified with the same local input skin and a slightly different replacing face intersecting the replaced face. This is illustrated by FIG. 41.

Figure 42:
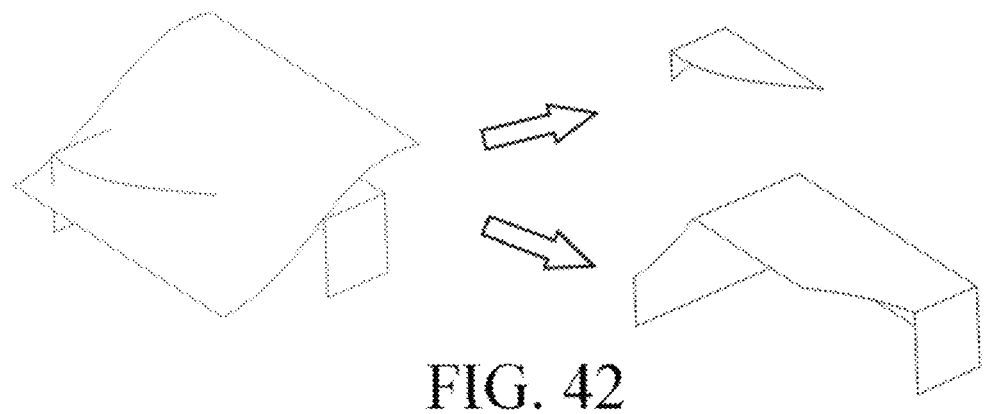

Splitting the local input skin with the replacing face yields two partial local input skins. This is illustrated by FIG. 42.

Figure 43:
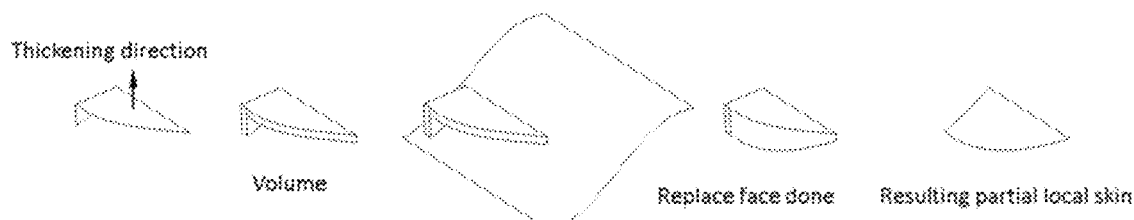

The non-intersecting algorithm is now performed on the first partial local skin, which yields the first resulting partial local skin. The steps are illustrated in FIG. 43.

Figure 44:
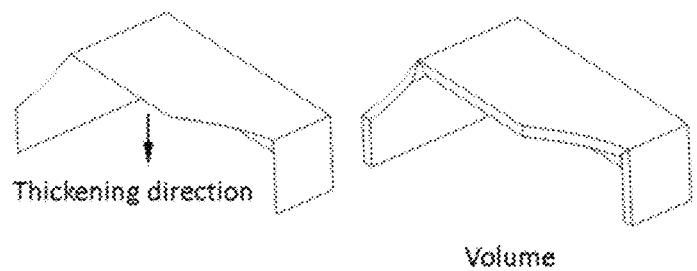
Figure 45:
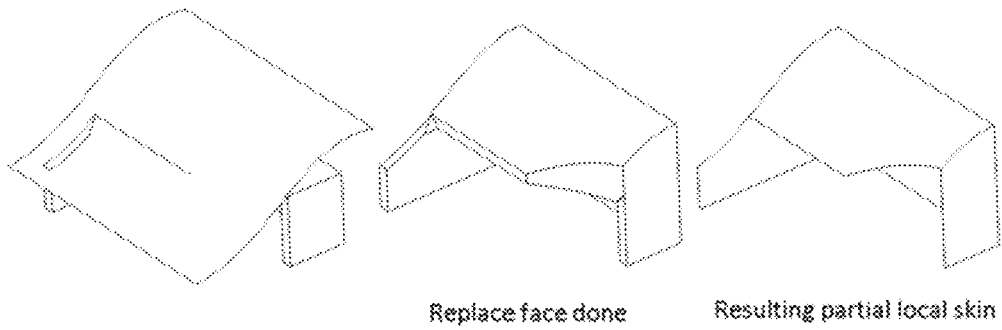

The non-intersecting algorithm is now performed on the second partial local skin, which yields the second resulting partial local skin. The steps are illustrated in FIGS. 44-45. Notice the opposite thickening direction compared to previous step.

Figure 46:
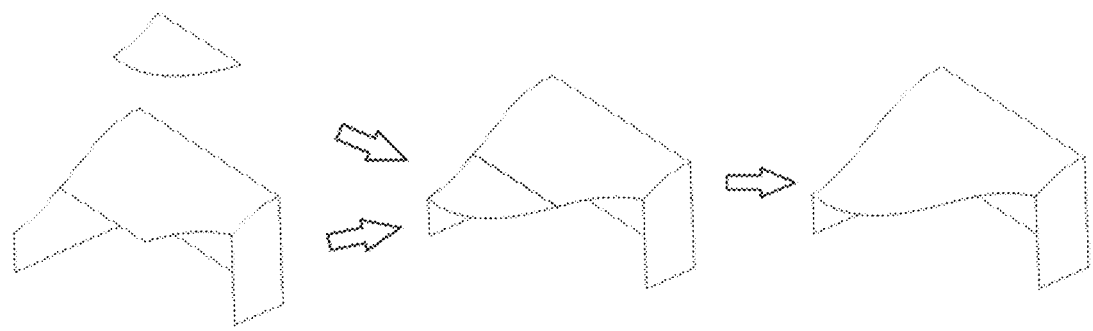

Resulting partial local skins are now joined to get the resulting local skin. Adjacent portions of the trimmed replacing face (center drawing FIG. 46) are merged so that their shared smooth edges are removed from the topology (right drawing in FIG. 46).

Figure 47:
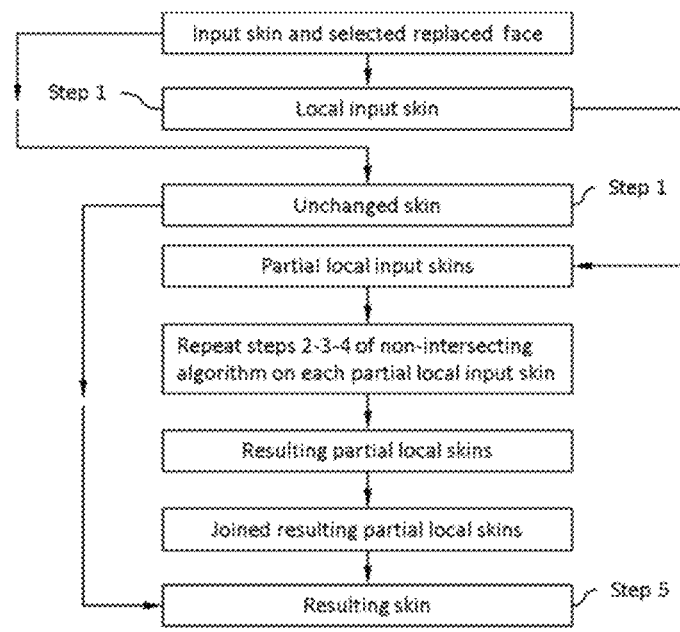

The diagram of FIG. 47 describes the algorithm in the intersecting situation by using the algorithm of the non-intersecting situation.

For the purpose of conciseness, the method has been discussed to operate a replacement of a single face by another single face. The method can however be used in other situations as well, for example to replace a set of adjacent faces of the input skin by another set of adjacent faces.

The invention claimed is:

1. A computer-implemented method for designing a 3D modeled object that represents a mechanical part, the method comprising:
   obtaining, at a CAD system, a B-Rep skin that represents the mechanical part, the B-rep skin having a B-rep portion including:
      a boundary face bounded by one or more boundary edges of the B-rep skin, a boundary edge bounding a respective boundary face being an edge which is not shared with a face other than the respective boundary face and thereby bounds only one face of the B-rep skin, and
      one or more first faces each adjacent to the boundary face at a respective internal edge of the B-rep skin;
   defining, by graphical user-interaction with the CAD system, a surface;
   constructing, automatically by the CAD system, a B-rep replacement, the constructing including:
      creating one or more second faces each adjacent to the boundary face and bounded by a respective boundary edge of the one or more boundary edges bounding the boundary face;
      generating a B-rep assembly which includes:
         one or more third faces each coincident with the surface, each third face having one or more edges, each edge of each third face being internal to the B-rep assembly and lying on the surface,
         one or more fourth faces each coincident with a first face of the one or more first faces and adjacent to a third face of the one or more third faces, each fourth face having two or more edges, at least two edges of each fourth face geometrically lying on a supporting surface of the respective first face with which the fourth face coincides, and
         one or more fifth faces each coincident with a second face of the one or more second faces and adjacent to a third face of the one or more third faces, each fifth face having two or more edges, at least two edges of each fifth face geometrically lying on a supporting surface of the respective second face with which the fifth face coincides; and
      removing from the B-rep assembly each fifth face; and
   replacing, in the B-Rep skin, the B-rep portion by the constructed B-rep replacement.

2. The computer-implemented method of claim 1, wherein the creating includes thickening the B-rep portion.

3. The computer-implemented method of claim 2, wherein the thickening includes:
   determining a B-rep offset of the B-rep portion;
   building one or more lateral faces that connect the B-rep offset to the B-rep portion; and
   determining the one or more second faces from the one or more lateral faces.

4. The computer-implemented method of claim 3, wherein the one or more lateral faces include one or more lateral ribbon faces, each lateral ribbon face being bounded by a respective boundary edge of the B-rep portion and a corresponding boundary edge of the B-rep offset, each lateral ribbon face adjacent to the boundary face and bounded by a respective boundary edge of the B-rep skin forming a respective second face.

5. The computer-implemented method of claim 4, wherein each lateral ribbon face forming a respective second face is supported by a ruled surface.

6. The computer-implemented method of claim 5, wherein the ruled surface is of the type $(w,t) \mapsto L(w,t)$ with $L(w,t)=S(u(w),v(w))+t\delta N\ (u(w),v(w))$, where:
- S is a supporting surface of F defined for parameters u and v, with F being a face of the B-rep portion bounded by the respective boundary edge,
- $\delta$ is an offset value,
- $N(u,v)$ is a normal vector of S defined for the parameters u and v, with being a supporting surface of P defined for the parameters u and v by $\overline{S}(u,v)=S\ (u,v)+\delta N\ (u,v)$, with P being a face of the B-rep offset bounded by the corresponding boundary edge,
- w is a parameter such that $w \mapsto S(u(w),v(w))$ is a 3D curve supporting the respective boundary edge, and
- t is a parameter $t \in [0,1]$.

7. The computer-implemented method of claim 6, wherein the mechanical part includes a bent and/or stamped planar sheet.

8. The computer-implemented method of claim 2, wherein the boundary face is fully located on a respective side of the surface, the thickening being performed in a direction opposite to the surface.

9. The computer-implemented method of claim 8, wherein the method further comprises, prior to the obtaining of the B-Rep skin, obtaining an initial B-Rep skin that represents the mechanical part, the initial B-Rep skin having an initial boundary face,
- wherein the surface partitions the initial boundary face into several boundary sub-faces, a respective boundary sub-face forming the boundary face of the B-Rep portion,
- wherein the obtaining of the B-Rep skin comprises partitioning the initial B-Rep skin into several B-Rep sub-skins, a respective B-Rep sub-skin forming the B-Rep skin,
- wherein each other B-Rep sub-skin has a respective B-Rep portion including a respective boundary sub-face bounded by one or more boundary edges of the other B-Rep sub-skin, and
- wherein the constructing and the replacing is performed for each other B-Rep sub-skin relative to its respective B-Rep portion.

10. The computer-implemented method of claim 1, wherein the generating further comprises producing:
- one or more third faces each by extrapolating and/or trimming the surface,
- one or more fourth faces each by extrapolating and/or trimming a supporting surface of the respective first face, and/or
- one or more fifth faces each by extrapolating and/or trimming a supporting surface of the respective second face.

11. The computer-implemented method of claim 10, wherein extrapolating a surface further comprises:
- when the surface is a canonical surface having a 2D parametric domain, extending the 2D parametric domain;
- when the surface is a procedural surface having input elements defining a 3D motion for sweeping a planar profile, extrapolating the input elements; and/or
- when the surface is a free-form surface, extending the surface curvature continuously.

12. The computer-implemented method of claim 1, wherein the mechanical part is:
- an automotive part, an aerospace part, a consumer good part, a defense part, an architecture part, a ship building part, a mining industry part, a marine and offshore part, or an industrial equipment part,
- a thin part, and/or
- a composite part, a plastic molded part, or a stamped part.

13. A non-transitory data storage medium having recorded thereon a computer program comprising instructions for performing a method for designing a 3D modeled object that represents a mechanical part, the method comprising:
- obtaining, at a CAD system, a B-Rep skin that represents the mechanical part, the B-rep skin having a B-rep portion including:
  - a boundary face bounded by one or more boundary edges of the B-rep skin, a boundary edge bounding a respective boundary face being an edge which is not shared with a face other than the respective boundary face and thereby bounds only one face of the one or more boundary edges bounding the boundary face, and
  - one or more first faces each adjacent to the boundary face at a respective internal edge of the B-rep skin;
- defining, by graphical user-interaction with the CAD system, a surface;
- constructing, automatically by the CAD system, a B-rep replacement, the constructing including:
  - creating one or more second faces each adjacent to the boundary face and bounded by a respective boundary edge of the B-rep skin;
  - generating a B-rep assembly which includes:
    - one or more third faces each coincident with the surface, each third face having one or more edges, each edge of each third face being internal to the B-rep assembly and lying on the surface,
    - one or more fourth faces each coincident with a first face of the one or more first faces and adjacent to a third face of the one or more third faces, each fourth face having two or more edges, at least two edges of each fourth face geometrically lying on a supporting surface of the respective first face with which the fourth face coincides, and
    - one or more fifth faces each coincident with a second face of the one or more second faces and adjacent to a third face of the one or more third faces, each fifth face having two or more edges, at least two edges of each fifth face geometrically lying on a supporting surface of the respective second face with which the fifth face coincides; and
  - removing from the B-rep assembly each fifth face; and
- replacing, in the B-Rep skin, the B-rep portion by the constructed B-rep replacement.

14. The non-transitory data storage medium of claim 13, wherein the creating includes thickening the B-rep portion.

15. The non-transitory data storage medium of claim 14, wherein the thickening includes:
- determining a B-rep offset of the B-rep portion;
- building one or more lateral faces that connect the B-rep offset to the B-rep portion; and
- determining the one or more second faces from the one or more lateral faces.

16. The non-transitory data storage medium of claim 15, wherein the one or more lateral faces include one or more lateral ribbon faces, each lateral ribbon face being bounded by a respective boundary edge of the B-rep portion and a corresponding boundary edge of the B-rep offset, each lateral ribbon face adjacent to the boundary face and bounded by a respective boundary edge of the B-rep skin forming a respective second face.

17. A system comprising:
a hardware processor coupled to a hardware memory, wherein the hardware memory has recorded thereon a computer program including instructions for designing a 3D modeled object that represents a mechanical part that when executed by the hardware processor causes the hardware processor to be configured to
obtain, at a CAD system, a B-Rep skin that represents the mechanical part, the B-rep skin having a B-rep portion including:
   a boundary face bounded by one or more boundary edges of the B-rep skin, a boundary edge bounding a respective boundary face being an edge which is not shared with a face other than the respective boundary face and thereby bounds only one face of the B-rep skin, and
   one or more first faces each adjacent to the boundary face at a respective internal edge of the B-rep skin;
define, by graphical user-interaction with the CAD system, a surface;
construct, automatically by the CAD system, a B-rep replacement, the constructing including:
   creating one or more second faces each adjacent to the boundary face and bounded by a respective boundary edge of the one or more boundary edges bounding the boundary face,
generating a B-rep assembly which includes:
   one or more third faces each coincident with the surface, each third face having one or more edges, each edge of each third face being internal to the B-rep assembly and lying on the surface,
   one or more fourth faces each coincident with a first face of the one or more first faces and adjacent to a third face of the one or more third faces, each fourth face having two or more edges, at least two edges of each fourth face geometrically lying on a supporting surface of the respective first face with which the fourth face coincides, and
   one or more fifth faces each coincident with a second face of the one or more second faces and adjacent to a third face of the one or more third faces, each fifth face having two or more edges, at least two edges of each fifth face geometrically lying on a supporting surface of the respective second face with which the fifth face coincides, and
   removing from the B-rep assembly each fifth face; and
replace, in the B-Rep skin, the B-rep portion by the constructed B-rep replacement.

18. The system of claim 17, wherein the creating includes thickening the B-rep portion.

19. The system of claim 18, wherein the thickening includes:
determining a B-rep offset of the B-rep portion;
building one or more lateral faces that connect the B-rep offset to the B-rep portion; and
determining the one or more second faces from the one or more lateral faces.

20. The system of claim 19, wherein the one or more lateral faces include one or more lateral ribbon faces, each lateral ribbon face being bounded by a respective boundary edge of the B-rep portion and a corresponding boundary edge of the B-rep offset, each lateral ribbon face adjacent to the boundary face and bounded by a respective boundary edge of the B-rep skin forming a respective second face.

* * * * *